United States Patent
Kanda et al.

(10) Patent No.: US 7,317,652 B2
(45) Date of Patent: Jan. 8, 2008

(54) SEMICONDUCTOR DEVICE, NONVOLATILE SEMICONDUCTOR MEMORY, SYSTEM INCLUDING A PLURALITY OF SEMICONDUCTOR DEVICES OR NONVOLATILE SEMICONDUCTOR MEMORIES, ELECTRIC CARD INCLUDING SEMICONDUCTOR DEVICE OR NONVOLATILE SEMICONDUCTOR MEMORY, AND ELECTRIC DEVICE WITH WHICH THIS ELECTRIC CARD CAN BE USED

(75) Inventors: Kazushige Kanda, Kanagawa (JP); Kenichi Imamiya, Tokyo (JP); Hiroshi Nakamura, Kanagawa (JP); Ken Takeuchi, Tokyo (JP); Tamio Ikehashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 11/203,393

(22) Filed: Aug. 12, 2005

(65) Prior Publication Data

US 2006/0039225 A1    Feb. 23, 2006

Related U.S. Application Data

(62) Division of application No. 10/322,785, filed on Dec. 18, 2002, now Pat. No. 7,057,947.

(30) Foreign Application Priority Data

Dec. 19, 2001  (JP) ............................. 2001-386053

(51) Int. Cl.
    *G11C 5/14* (2006.01)
(52) U.S. Cl. ...................... 365/226; 365/229; 365/191; 365/193; 365/189.08

(58) Field of Classification Search ................ 365/226, 365/229, 191, 193, 189.08
See application file for complete search history.

(56) References Cited

U.S. PATENT DOCUMENTS

| | | | |
|---|---|---|---|
| 5,300,840 A | 4/1994 | Drouot | 327/51 |
| 5,307,319 A | 4/1994 | Kohketsu et al. | 365/230.08 |
| 5,361,365 A * | 11/1994 | Hirano et al. | 713/1 |
| 5,608,678 A | 3/1997 | Lysinger | 365/200 |
| 5,805,435 A * | 9/1998 | Pascucci | 363/59 |
| 5,989,959 A * | 11/1999 | Araki | 438/258 |
| 6,058,052 A | 5/2000 | Steadman | 365/200 |
| 6,351,109 B1 | 2/2002 | Yoshida | 323/284 |
| 6,388,929 B1 | 5/2002 | Shimano et al. | 365/201 |
| 6,418,075 B2 * | 7/2002 | Shimano et al. | 365/227 |
| 6,556,479 B2 | 4/2003 | Makuta et al. | 365/185.09 |
| 6,667,928 B2 | 12/2003 | Honma et al. | 365/226 |
| 6,700,817 B2 | 3/2004 | Atsumi et al. | 365/185.09 |
| 6,762,969 B2 | 7/2004 | Sasaki et al. | 365/225.7 |
| 6,870,786 B2 * | 3/2005 | Kanda et al. | 365/225.7 |

FOREIGN PATENT DOCUMENTS

JP          59079327 A *   5/1984

(Continued)

*Primary Examiner*—Viet Q. Nguyen
(74) *Attorney, Agent, or Firm*—Hogan & Hartson LLP

(57) ABSTRACT

A semiconductor device of this invention includes a first circuit for initializing a predetermined circuit in accordance with the level of a power source voltage, a second circuit for controlling the output from the first circuit by activation or deactivation, and an activation control circuit for activating or deactivating the second circuit in accordance with external input.

9 Claims, 24 Drawing Sheets

FOREIGN PATENT DOCUMENTS

| | | |
|---|---|---|
| JP | 01-223521 | 9/1989 |
| JP | 405019904 A * | 1/1993 |
| JP | 02001057086 | 2/2001 |
| KR | 1992-7002533 | 9/1992 |
| KR | 2000-0062650 | 10/2000 |

* cited by examiner

| OUTPUT LEVEL \ TIME | A | B | C | D |
|---|---|---|---|---|
| a (PRDIS) | L | L | L | L |
| b (PWONRST) | L | L | H | L |
| c (PWONRST2) | L | H | H | H |
| d (OUTPUT FROM IN52) | H | L | L | L |
| e (OUTPUT FROM IN51) | H | H | L | H |
| f (OUTPUT FROM SR) | L | L | H | H |
| g (OUTPUT FROM NA51) | H | H | H | H |
| h (LOWVDD) | L | L | H | L |

RESET AGAIN

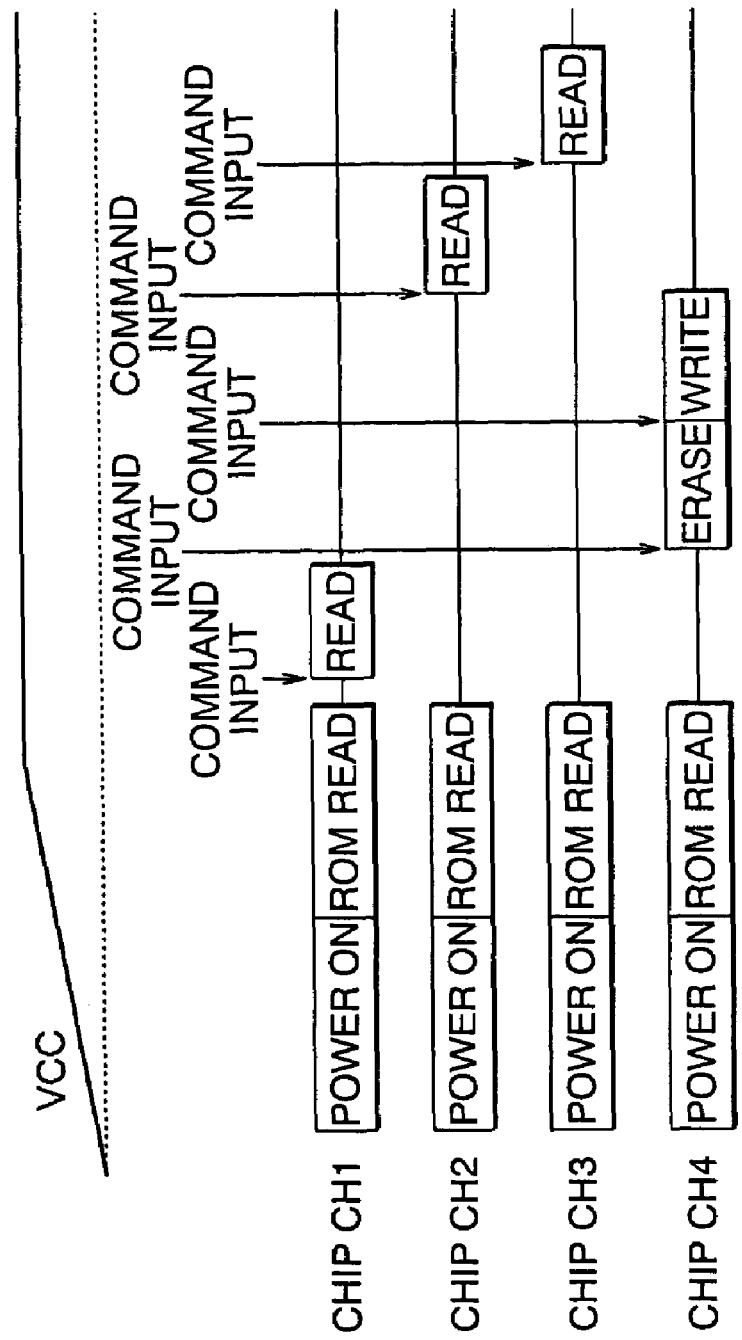

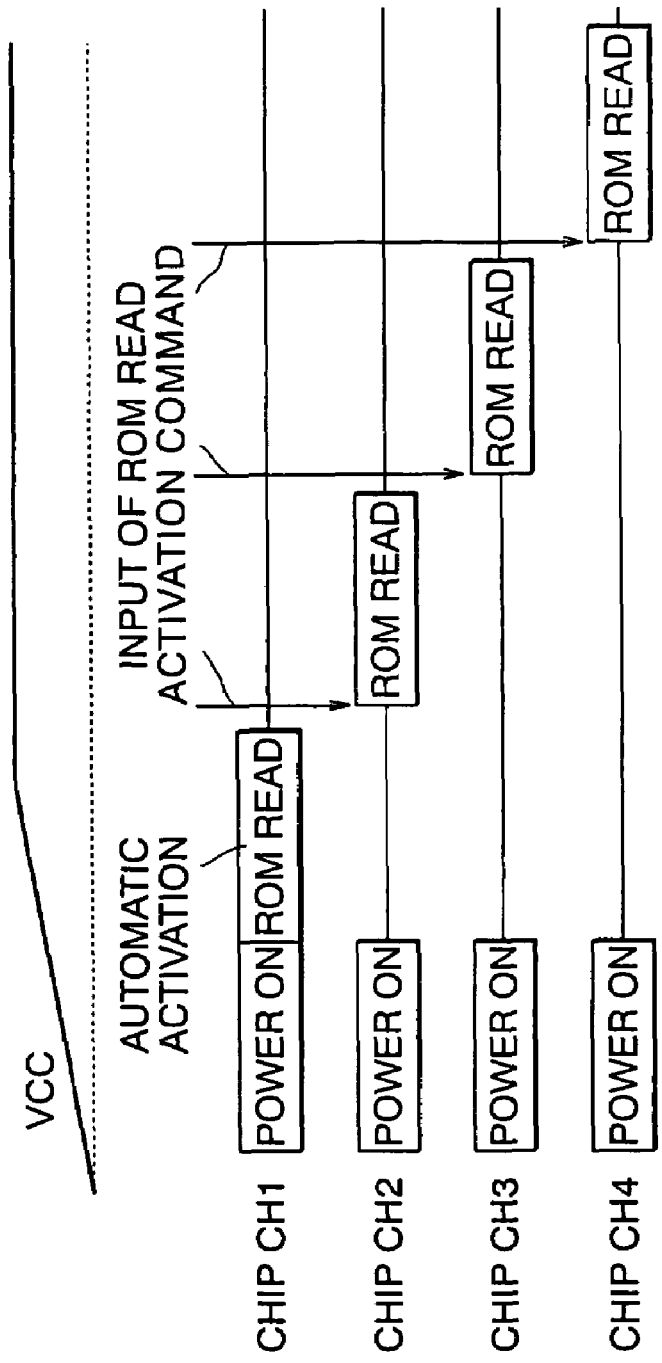

SEMICONDUCTOR DEVICE, NONVOLATILE SEMICONDUCTOR MEMORY, SYSTEM INCLUDING A PLURALITY OF SEMICONDUCTOR DEVICES OR NONVOLATILE SEMICONDUCTOR MEMORIES, ELECTRIC CARD INCLUDING SEMICONDUCTOR DEVICE OR NONVOLATILE SEMICONDUCTOR MEMORY, AND ELECTRIC DEVICE WITH WHICH THIS ELECTRIC CARD CAN BE USED

CROSS REFERENCE TO RELATED APPLICATION

This is a divisional of application Ser. No. 10/322,785 filed Dec. 18, 2002, now U.S. Pat. No. 7,057,947 the entire contents of which is incorporated by reference. This application also claims benefit of priority under 35 USC 119 from the Japanese Patent Application No. 2001-386053, filed on Dec. 19, 2001, the entire contents of which are incorporated herein by reference.

BACKGROUND OF THE INVENTION

The present invention relates to a semiconductor device, a nonvolatile semiconductor memory, a system including a plurality of semiconductor devices or nonvolatile semiconductor memories, electric card including a semiconductor device or nonvolatile semiconductor memory, and an electric device with which this electric card can be used.

FIG. 22 shows the circuit configuration of a conventionally used nonvolatile semiconductor memory by taking a nonvolatile semiconductor memory as an example. This nonvolatile semiconductor memory includes a memory cell array MCA, address buffer ABF, column decoder CDC, row decoder RDC, sense amplifier S/A, fuse register FRG, I/O buffer IOBF, power-on reset circuit PORC, control circuit CT101, and voltage generation circuit VGC.

The memory cell array MCA has normal memory cell areas MC1 and MC2 for storing data, and a ROM fuse RF for storing data (to be referred to as fuse data hereinafter) required to be read out after the power source is turned on. Examples of this fuse data are replacement data for replacing defective portions in the memory cell areas MC1 and MC2 with other redundancy circuits, and trimming data for adjusting a timer and voltage generator.

Of input data to the address buffer ABF, a column address is input to and decoded by the column decoder CDC, a row address is input to and decoded by the row decoder RDC, and data write or read operation with respect to the memory cell MC1 or MC2 in the memory cell array MCA is performed at the designated address. When data is to be read out, the data is output via the sense amplifier S/A and I/O buffer IOBF. When data is to be written, the data is supplied to the memory cell array MCA via the I/O buffer IOBF. Also, the fuse data stored in the ROM fuse RF is supplied to and held in the fuse register FRG via the sense amplifier S/A and column decoder CDC.

The voltage generation circuit VGC uses an externally supplied power source voltage VCC to generate various voltages such as a reference voltage Vref and program voltage Vpg.

The power-on reset circuit PORC outputs a low-level, power-on reset signal PWONRSTn before the power source voltage reaches a power-on detection level V2 after the power source is turned on. When the power source voltage reaches this power-on detection level V2, the power-on reset circuit PORC outputs a high-level, power-on reset signal PWONRSTn to the control circuit CT101.

On the basis of this power-on reset signal PWONRSTn, the control circuit CT101 initializes the whole device, i.e., the address buffer ABF, fuse register FRG, column decoder CDC, sense amplifier S/A, row decoder RDC, and voltage generation circuit VGC, among other circuits shown in FIG. 22, by supplying an initialization control signal to these components.

To initialize the entire device, the above-mentioned fuse data stored in the ROM fuse RF must be read out and latched. If this fuse data is stored in a fuse circuit formed by a fuse which is blown by a laser, this fuse data is read. A read circuit for reading this fuse data is formed as a CMOS logic circuit. The level of a power source voltage with which this read circuit is activated is set to be equal to or higher than a voltage Vlgc at which the CMOS logic circuit starts operating.

In the nonvolatile semiconductor memory as shown in FIG. 22, however, a specific area (the ROM fuse RF) in the memory cell array MCA can be allocated as a means for storing the fuse data.

In this case, the fuse data must be read out similar to normal data when the device is initialized. So, this data is readout from the ROM fuse RF (this operation will be referred to as ROM read hereinafter).

In this operation, as shown in FIG. 23, the power-on detection level V2 must be set higher than a minimum voltage V1 at which at least read operation is possible. Assume that, in a course during which the power source is turned on and the level rises, the power source voltage reaches the minimum operating voltage V1 at which read operation is possible at time T2, ROM read is started when the power source voltage reaches the power-on detection level V2 (V2>V1) at time T3, and this read is performed from time T3 to time T4.

This ROM read is desirably performed automatically when the power source is turned on (power ON), i.e., started immediately after initialization is complete after the power source is turned on. A signal for controlling this ROM read is generated by the control circuit CT101 which receives the high-level, power-on reset signal PWONRSTn output from the power-on reset signal PORC.

For example, a circuit shown in FIG. 24 is used in this power-on reset circuit PORC. The power source voltage VCC is divided by resistors R1 and R2, and a divided level N1 is supplied to the gate of a P-channel transistor PT1. This P-channel transistor PT1, a depression type transistor DT1, and a resistor R3 are connected between a power source voltage VCC terminal and ground terminal. The potential at the connection point of the drains of the transistors PT1 and DT1 is delayed by a delay circuit INC formed by an inverter array. This delayed potential is output as the power-on reset signal PWONRSTn.

The circuit configuration of the control circuit CT101 is as shown in FIG. 25. The power-on reset signal PWONRSTn input to this control circuit CT101 is supplied to a different control circuit OCT, a pulse generator PG11, and a ROM read controller RRC.

The pulse generator PG11 supplies, to a NAND gate NA11, a signal which is obtained by inverting the power-on reset signal PWONRSTn by an inverter IN11 and delaying this inverted signal by a delay circuit DL, and the power-on reset signal PWONRSTn, thereby generating a signal which is at low level only for the delay time. An inverter IN12 inverts this signal to apply an activation pulse ROMRDSTT to a set terminal Set.

The ROM read controller RRC is reset when the power-on reset signal PWONRSTn which is input to a reset terminal/ Reset is at low level after the power source is turned on. When the activation pulse ROMRDSTT is input after that, the ROM read controller RRC generates a control signal for starting ROM read, and outputs this control signal to the individual circuits for performing ROM read.

As shown in FIG. 24, fluctuations in the threshold voltage of the P-channel transistor PT1 are reflected on the generation of the power-on reset signal PWONRSTn. This varies the detected level V2 shown in FIG. 23. Accordingly, the power-on detection level V2 when the power-on reset signal PWONRSTn is to be generated is so set as to have a large margin with respect to the power source voltage specification.

Consequently, this power-on detection level V2 is set at a very low voltage near the voltage V1 at which read operation is possible. So, ROM read must be performed at a low power source voltage.

The conventional device has the following problems since ROM read is thus started near the voltage V1 at which read operation is possible.

First, when ROM read is started at a low power source voltage, this power source voltage sometimes slightly lowers owing to large current consumption required for the read operation. As a consequence, the power source voltage may become lower than the voltage V1 at which read operation is possible, and may make it impossible to accurately read out fuse data important as chip initial data. This may interfere with the subsequent operation.

Also, if, after ROM read is performed, the readout data is found to have an error due to a circuit defect, variation in the characteristics of elements forming the circuit, or fluctuation or defect in the fabrication process, this defective portion cannot be replaced with a redundancy circuit unless ROM read is executed again. This makes the whole device unusable.

If an automatic sequence is so programmed as to start ROM read again in a case like this, the result is "fail" whenever ROM read is performed, so ROM read is permanently repeated.

SUMMARY OF THE INVENTION

According to one aspect of the present invention, a semiconductor device comprises a first circuit for initializing a predetermined circuit in accordance with the level of a power source voltage, a second circuit for controlling the output from the first circuit by activation or deactivation, and an activation control circuit for activating or deactivating the second circuit in accordance with external input.

According to one aspect of the present invention, a nonvolatile semiconductor memory comprises a fuse data storage for storing fuse data including replacement data for replacing a first area with a second area in a memory cell array, a fuse data read unit for reading out the fuse data from the fuse data storage, a read control circuit which, when activated, outputs a control signal for reading out the fuse data to the fuse data read unit, and an activation control circuit for activating or deactivating the read control circuit in accordance with external input.

According to another aspect of the present invention, a semiconductor device comprises an initialization control circuit for outputting an initialization signal for initializing a predetermined circuit, a first power-on reset circuit for outputting a first power-on reset signal when a power source voltage exceeds a first level, and a second power-on reset circuit for outputting a second power-on reset signal when the power source voltage exceeds a second level higher than the first level, wherein the initialization control circuit outputs the initialization signal when the second power-on reset signal is output after the power source is turned on, and, even if this second power-on reset signal is output again thereafter, does not output the initialization signal unless the first power-on reset signal is output again.

According to one aspect of the present invention, a nonvolatile semiconductor memory comprises a fuse data storage for storing fuse data including replacement data for replacing a first area with a second area in a memory cell array, a fuse data read unit for reading out the fuse data from the fuse data storage, a read control circuit which, when activated, outputs a control signal for reading out the fuse data to the fuse data read unit, and an activation control circuit for controlling activation or deactivation of the read control circuit, wherein if a predetermined command is input for the first time, the activation control circuit interprets that this command is a command for reading out the fuse data, and activates the read control circuit, and, if the predetermined command is input for the second time or after that, the activation control circuit interprets that this command is not a command for reading out the fuse data, and deactivates the read control circuit.

BRIEF DESCRIPTION OF THE DRAWINGS

FIGS. 15A and 15B are views for explaining an automatic ROM read operation in the arrangement shown in FIGS. 14A and 14B;

FIGS. 18A and 18B are views showing an automatic ROM read operation in the arrangement shown in FIGS. 17A and 17B;

DESCRIPTION OF THE PREFERRED EMBODIMENTS

Embodiments of the present invention will be described below with reference to the accompanying drawings. A semiconductor device in each embodiment includes no memory cell array. A nonvolatile semiconductor memory in each embodiment includes a memory cell array in addition to the configuration of a semiconductor device.

(1) First Embodiment

Figure 1:
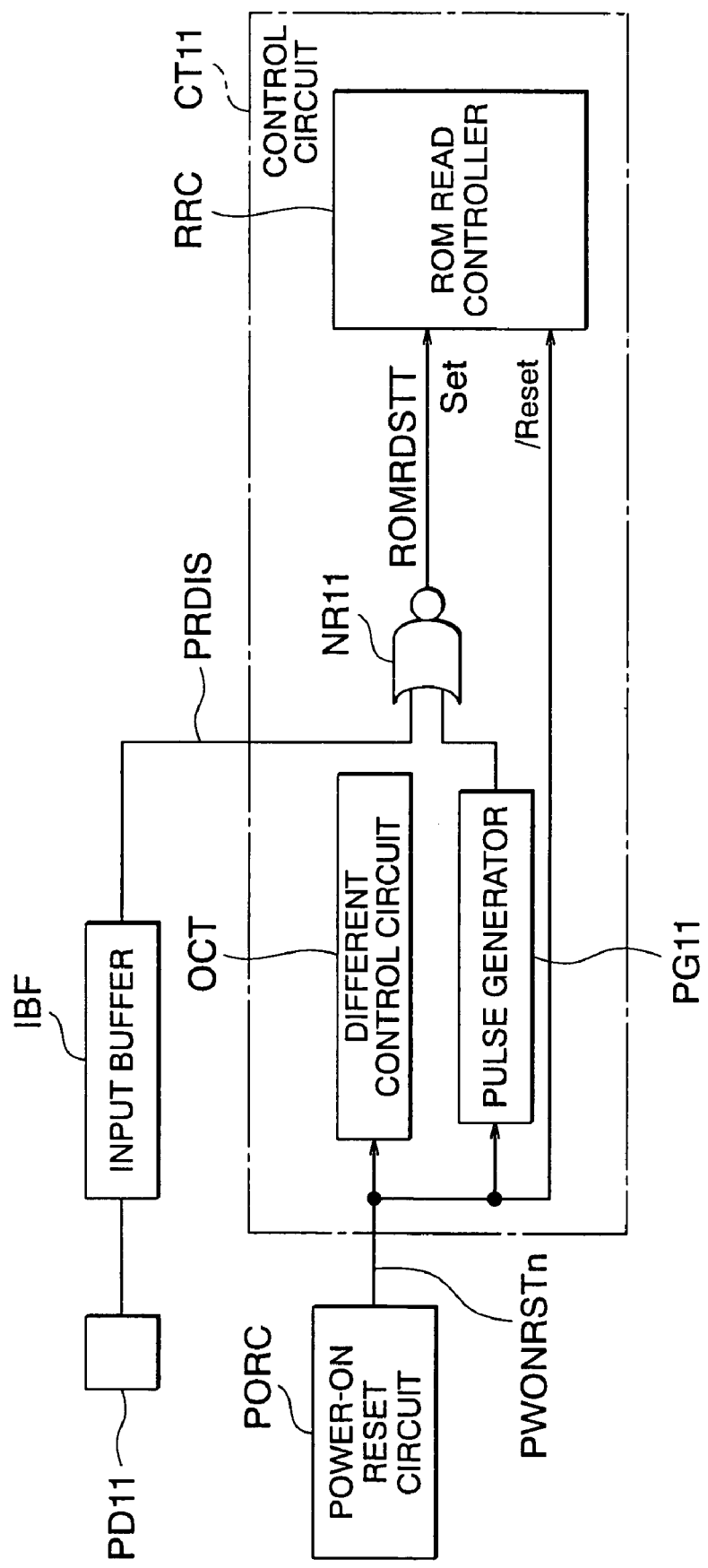
FIG. 1 is a block diagram showing the arrangement of the first embodiment of the present invention.
Figure 22:
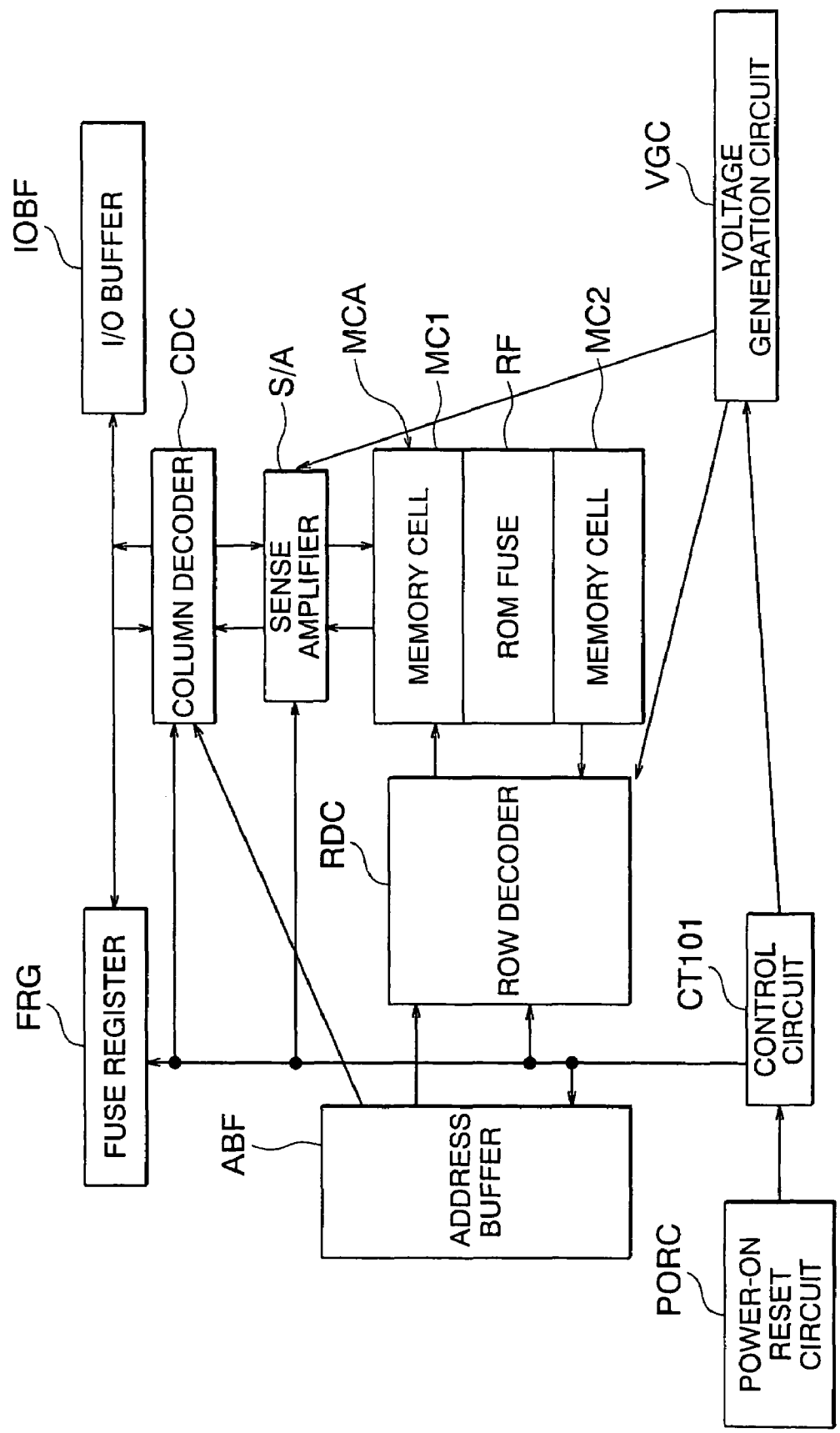
FIG. 22 is a block diagram showing the arrangement of a conventional nonvolatile semiconductor memory.

FIG. 1 shows the circuit configuration of the first embodiment of the present invention. Unlike the conventional control circuit CT101 shown in FIG. 25, this embodiment has an arrangement in which whether to automatically activate ROM read after the power source is turned on is controlled in accordance with the voltage applied to an input pad PD11. In an outline of the arrangement of the whole device shown in FIG. 22, an explanation of common elements will be omitted except for differences in the configuration of the control circuit CT101.

When ROM read is not to be automatically activated after the power source is turned on, a high-level voltage PRDIS (Power-on Read DISable) (e.g., 2.5 V) is applied to the input pad PD11. When ROM read is to be automatically activated, a lower level (e.g., a ground level) is applied. The applied voltage is amplified by an input buffer IBF, and input to one input terminal of a NOR gate NR11 of a control circuit CT11.

This control circuit CT11 has a different control circuit OCT, a pulse generator PG11, the NOR gate NR11, and a ROM read controller RRC.

A low-level, power-on reset signal PWONRSTn is supplied to the different control circuit OCT and the pulse generator PG11, and to a reset terminal/Reset of the ROM read controller RRC to reset it. When the power source voltage reaches a power-on detection level after that, the power-on reset signal PWONRSTn output from a power-on reset circuit PORC changes from low level to high level.

The different control circuit OCT outputs control signals necessary for operations other than ROM read, such as write and read with respect to memory cells MC1 and MC2, to circuits for performing these operations.

Figure 25:
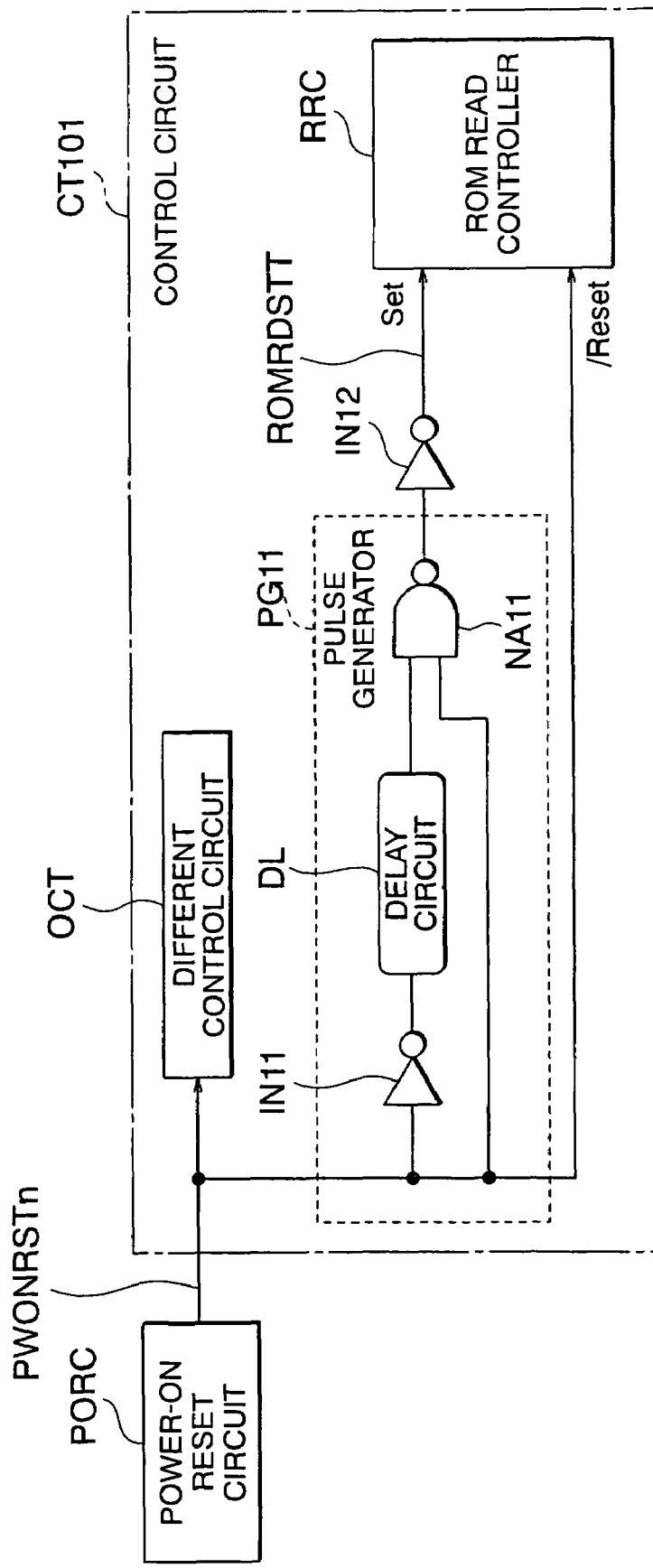
FIG. 25 is a block diagram showing the configuration of a control circuit in the memory shown in FIG. 22.

The pulse generator PG11 has the same arrangement as the pulse generator PG11 shown in FIG. 25. When receiving a high-level, power-on reset signal PWONRSTn, this pulse generator PG11 generates a pulse for starting ROM read, which is at low level for a predetermined period.

This pulse is input to the other terminal of the two-input NOR gate NR11. As described above, the high- or low-level voltage applied to the terminal PD11 is input to the aforementioned terminal of the NOR gate NR11.

Figure 2:
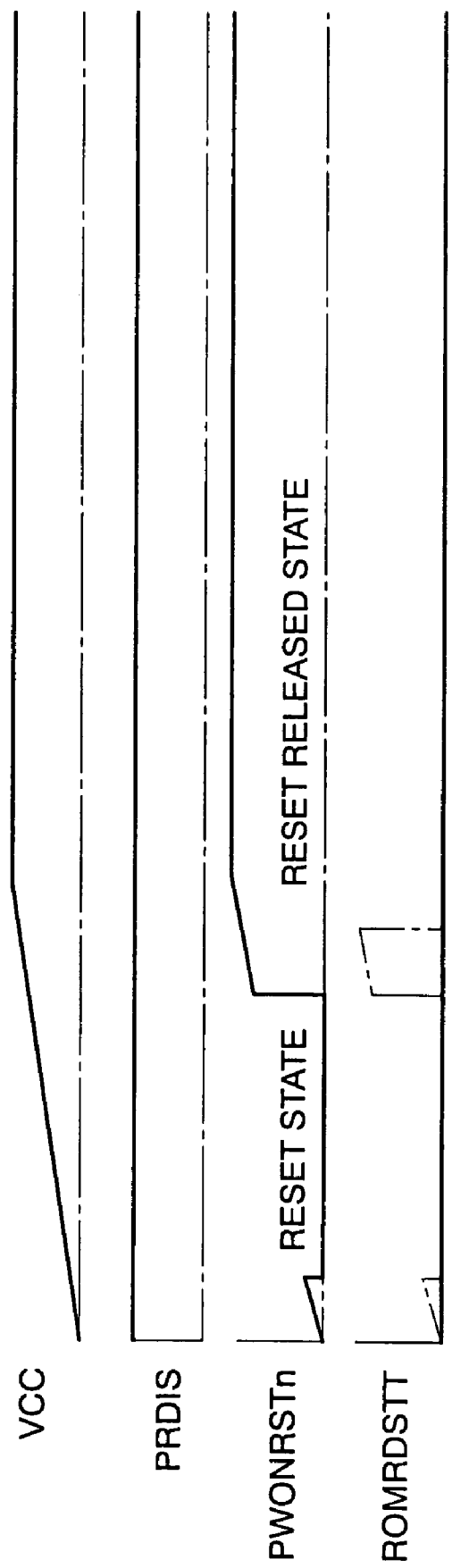
FIG. 2 is a timing chart showing operating waveforms in the first embodiment.

FIG. 2 is a timing chart showing the operating waveforms of the voltage PRDIS input to the terminal PD11, the power-on reset signal PWONRSTn, and an activation signal ROMRDSTT output from the NOR gate NR11.

When the power source is turned on, a power source voltage VCC gradually rises. When this power source voltage VCC reaches the power-on detection level, the power-on reset signal PWONRSTn changes to high level as indicated by the solid line.

If the voltage PRDIS input to the terminal PD11 is at low level as indicated by the alternate long and short dashed line, the NOR circuit NR11 inverts the pulse from the pulse generator PG11. This inverted pulse is input as the high-level activation signal ROMRDSTT indicated by the alternate long and short dashed line to a set terminal Set of the ROM read controller RRC, and the ROM read controller RRC outputs as a control signal required for ROM read. As a consequence, ROM read is automatically activated when the power source reaches the detection level after the power source is turned on.

On the other hand, if the high-level signal PRDIS as indicated by the solid line is input to the terminal PD11, the output level from the NOR gate NR11 is forcibly fixed to low level as indicated by the solid line regardless of the output level from the pulse generator PG11. Consequently, not high-level activation signal ROMRDSTT is input to the set terminal Set of the ROM read controller RRC. So, no ROM read is automatically activated even if the power source reaches the detection level after the power source is turned on. That is, after the power source is turned on, no ROM read is automatically activated, and inputting of a command from the user is waited for.

If a defect occurs when the device is operated in the stage of development and the like, it is important to investigate the cause. Also, as described previously, defects are readily caused by a decrease in the power source voltage during ROM read. Therefore, in accordance with this embodiment, high level is applied as the voltage PRDIS to the input pad PD11, and no ROM read is activated even when the power source reaches the detection level after the power source is turned on. If abnormality is detected, it is possible to specify that the operation error is caused in the portion for performing ROM read. If no abnormality is detected, the cause of the operation error is in the rest of the circuit. This contributes to locating a defective portion.

In addition, this embodiment facilitates specifying whether to automatically activate ROM read in accordance with the user's demand.

That is, even when the specifications are determined such that ROM read is not automatically activated but is performed when a ROM read command is input by the user after the power source is turned on and the power source reaches the detection level, these specifications can be easily implemented by connecting the input pad PD11 to a power source voltage VCC terminal (not shown) by wire bonding or the like and fixing the potential to high level.

(2) Second Embodiment

Figure 3:
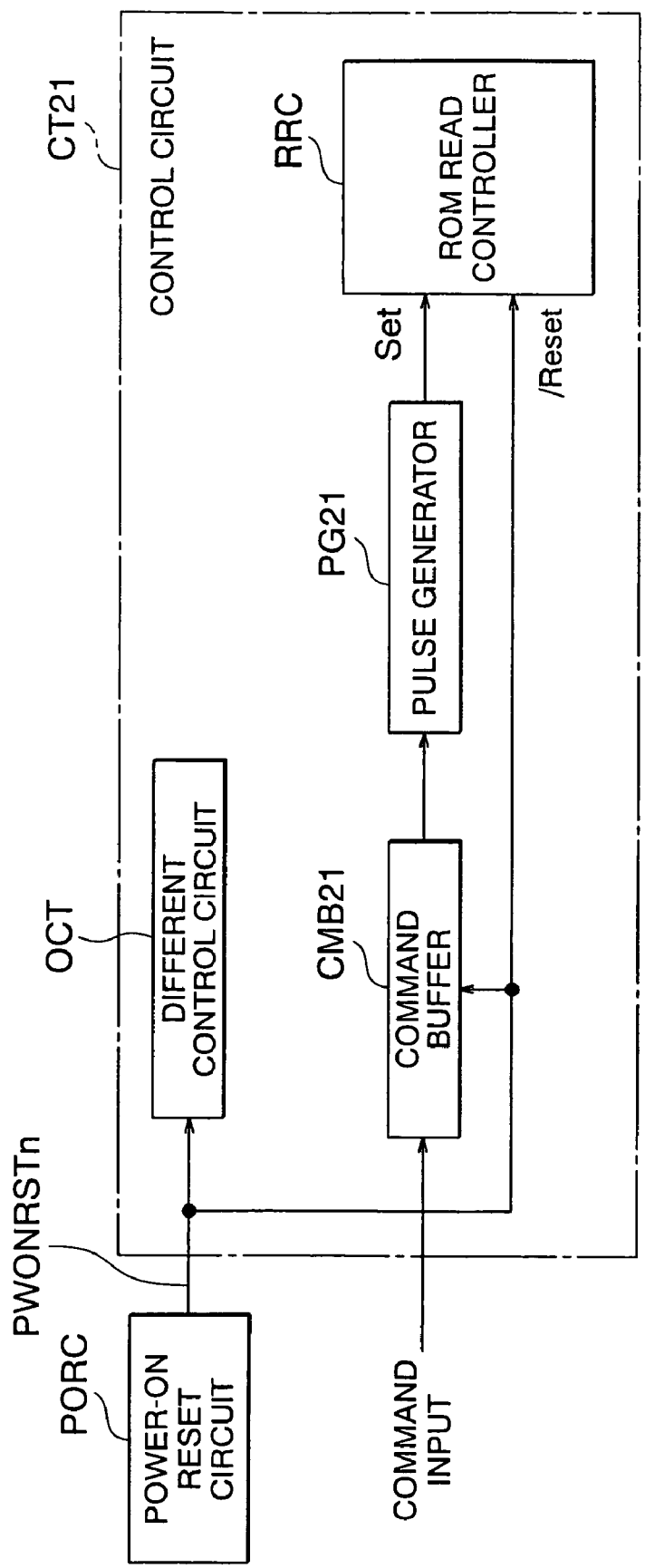
FIG. 3 is a block diagram showing the arrangement of the second embodiment of the present invention.

The second embodiment of the present invention will be described below with reference to FIG. 3 showing its arrangement. In this embodiment, ROM read is started after a command is input.

A control circuit CT21 of this embodiment has a different control circuit OCT, a command buffer CMB21, a pulse generator PG21, and a ROM read controller RRC.

A power-on reset signal PWONRSTn output from a power-on reset circuit PORC is input to the different control circuit OCT and the command buffer CMB21, and to a reset terminal/Reset of the ROM read controller RRC.

The command buffer CMB21 holds a ROM read command supplied from a user's program, and outputs the held command to the pulse generator PG21. When receiving this command, the pulse generator PG21 outputs an activation pulse which is at high level for a predetermined period to a set terminal Set of the ROM read controller RRC. The ROM read controller RRC receives this activation pulse and outputs a control signal for starting ROM read.

In this embodiment, after the power source is turned on and the power source reaches the detection level, no ROM read is automatically activated, and a ROM read command must be input.

Accordingly, when a ROM read command is supplied to the control circuit CT21 by a program created by the user, the power source voltage has already reached the level determined by the specifications. This makes it possible to avoid problems such as variations in the power-on detection level when ROM read is automatically activated, and ROM read errors when the power source voltage decreases due to the large current consumption during ROM read.

(3) Third Embodiment

Figure 4:
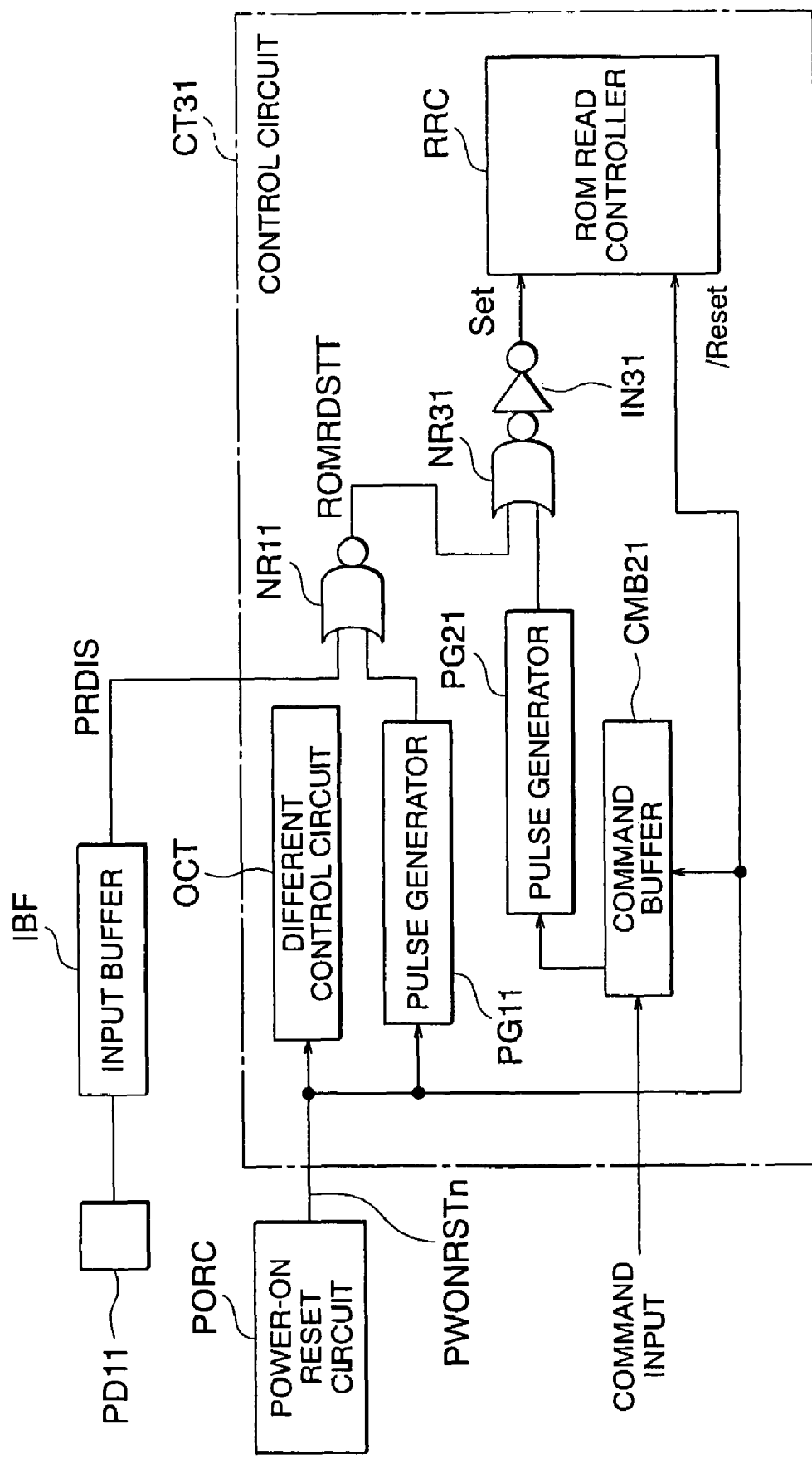
FIG. 4 is a block diagram showing the arrangement of the third embodiment of the present invention.

FIG. 4 shows the arrangement of the third embodiment of the present invention. This embodiment is a combination of the arrangements of the first and second embodiments described above.

That is, the third embodiment includes an input pad PD11, an input buffer IBF, a different control circuit OCT, a pulse generator PG11, and a NOR gate NR11 as in the first embodiment shown in FIG. 1, a command buffer CMB21 and pulse generator PG21 as in the second embodiment shown in FIG. 3, a NOR gate NR31 for receiving the outputs from the NOR gate NR11 and pulse generator PG21, an inverter IN31 for inverting the output from the NOR gate NR31, and a ROM read controller RRC having a set terminal Set for receiving the output from the inverter IN31 and a reset terminal/Reset for receiving a power-on reset signal PWONRSTn.

Since the same arrangement as the first embodiment is included, this third embodiment achieves the same functions and effects as the first embodiment. When the power source is turned on and the power source voltage reaches a power-on detection level, a power-on reset circuit PORC outputs a high-level, power-on reset signal PWONRSTn.

When receiving a trigger signal for changing this power-on reset signal PWONRSTn to high level, the pulse generator PG11 generates a pulse which is at low level for a predetermined period. This pulse is input to one terminal of the two-input NOR gate NR11, and the high- or low-level voltage applied to the terminal PD11 is input to the other terminal.

If an input voltage PRDIS to the terminal PD11 is at low level, the NOR gate NR11 inverts the pulse from the pulse generator PG11. This inverted pulse is input as a high-level activation signal ROMRDSTT to the set terminal Set of the ROM read controller RRC, and a control signal of the ROM read is output. Accordingly, ROM read is automatically activated after the power source is turned on and the power source reaches the detection level.

On the other hand, if a high-level signal PRDIS is input to the terminal PD11, a low-level activation signal ROMRDSTT is input to the set terminal Set of the ROM read controller RRC, so no ROM read is automatically activated even when the power source reaches the detection level after the power source is turned on. That is, after the power source is turned on, no ROM read is automatically activated, and inputting of a command by the user is waited for.

In this case, since the same arrangement as the second embodiment is included, an input command is held in the command buffer CMB21 and supplied to the pulse generator PG21. When receiving this command, the pulse generator PG21 outputs an activation pulse which is at high level for a predetermined period to the set terminal Set of the ROM read controller RRC. Accordingly, the ROM read controller RRC outputs a control signal to start ROM read.

This embodiment including the same arrangement as the first embodiment achieves the same functions and effects as the first embodiment.

If a defect occurs when the device is operated, automatic activation of ROM read is stopped by applying the high-level voltage PRDIS to the input pad PD11, in order to investigate the cause of the defect. If no abnormality is detected, it is possible to specify that the operation error is caused in the circuit for performing ROM read. If abnormality is detected, it is possible to specify that the cause of the operation error is in the rest of the circuit.

In addition, this embodiment facilitates specifying whether to automatically activate ROM read in accordance with the user's demand, by setting the voltage applied to the input pad PD11.

That is, if the specifications are determined such that ROM read is not automatically activated but is performed when a ROM read command is input by the user after the power source is turned on and the power source reaches the detection level, these specifications can be easily set by connecting the input pad PD11 to a power source voltage VCC terminal (not shown) by wire bonding or the like and fixing the potential to high level.

On the other hand, if the specifications are determined such that ROM read is automatically activated without waiting for a command input from the program, these specifications can be easily set by connecting the input pad PD11 to a ground terminal Vss (not shown) by wire bonding or the like and fixing the potential to low level.

Also, this third embodiment including the arrangement of the second embodiment achieves the same functions and effects as the second embodiment. That is, when a ROM read command is supplied to the control circuit CT21 by a program created by the user, the power source voltage has already reached the level determined by the specifications. This makes it possible to avoid problems such as variations in the power-on detection level when ROM read is automatically activated, and ROM read errors when the power source voltage decreases due to the large current consumption during ROM read.

(4) Fourth Embodiment

Figure 5:
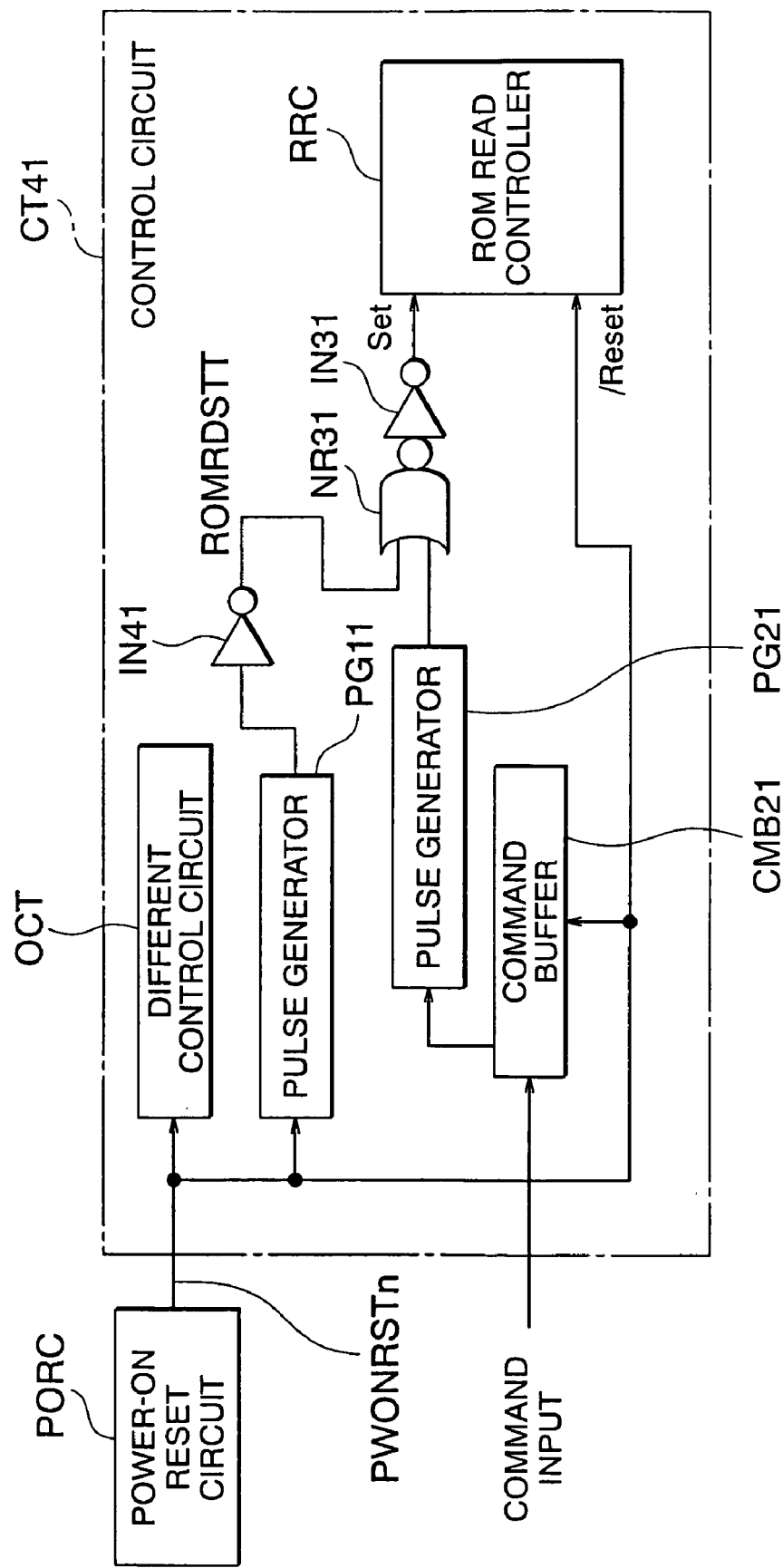
FIG. 5 is a block diagram showing the arrangement of the fourth embodiment of the present invention.

The fourth embodiment of the present invention will be described below with reference to FIG. 5 showing its arrangement. In this embodiment, the input pad PD11 for applying a voltage PRDIS and the input buffer IBF which receives and holds this voltage PRDIS are omitted from the arrangement of the third embodiment shown in FIG. 4. Accordingly, the NOR gate NR11 having one terminal for receiving the output voltage PRDIS from the input buffer IBF and the other terminal for inputting the output from a pulse generator PG11 is replaced with an inverter IN41.

As in the third embodiment described above, when the power source is turned on and the power source voltage reaches a power-on detection level, a power-on reset circuit PORC outputs a high-level, power-on reset signal PWONRSTn.

When receiving this power-on reset signal PWONRSTn, the pulse generator PG11 generates a pulse which is at low level for a predetermined period. This pulse is input to and inverted by the inverter IN41, and output as a high-level activation signal ROMRDSTT to one terminal of a NOR gate NR31. Therefore, regardless of the level of the other terminal of this NOR gate NR31, a low-level signal is output and inverted by the inverter IN31. An activation pulse is input to a set terminal Set of a ROM read controller RRC, and a ROM read control signal is output. In this manner, ROM read is automatically activated when the power-on detection level is reached after the power source is turned on.

In addition to the above system which automatically activates ROM read after the power source reaches the detection level, this embodiment has a system which activates ROM read when a command is input. When a ROM read command is input from a program supplied by the user, this command is held in a command buffer CMB21 and supplied to a pulse generator PG21. Upon receiving this command, the pulse generator PG21 outputs an activation pulse which is at high level for a predetermined period. This activation pulse is input to the other terminal of the NOR gate NR31, and a low-level activation pulse is output. The activation pulse is inverted by the inverter IN31 and input to the set terminal Set of the ROM read controller RRC. This allows activation of ROM read even with inputting of a command.

Figure 6:
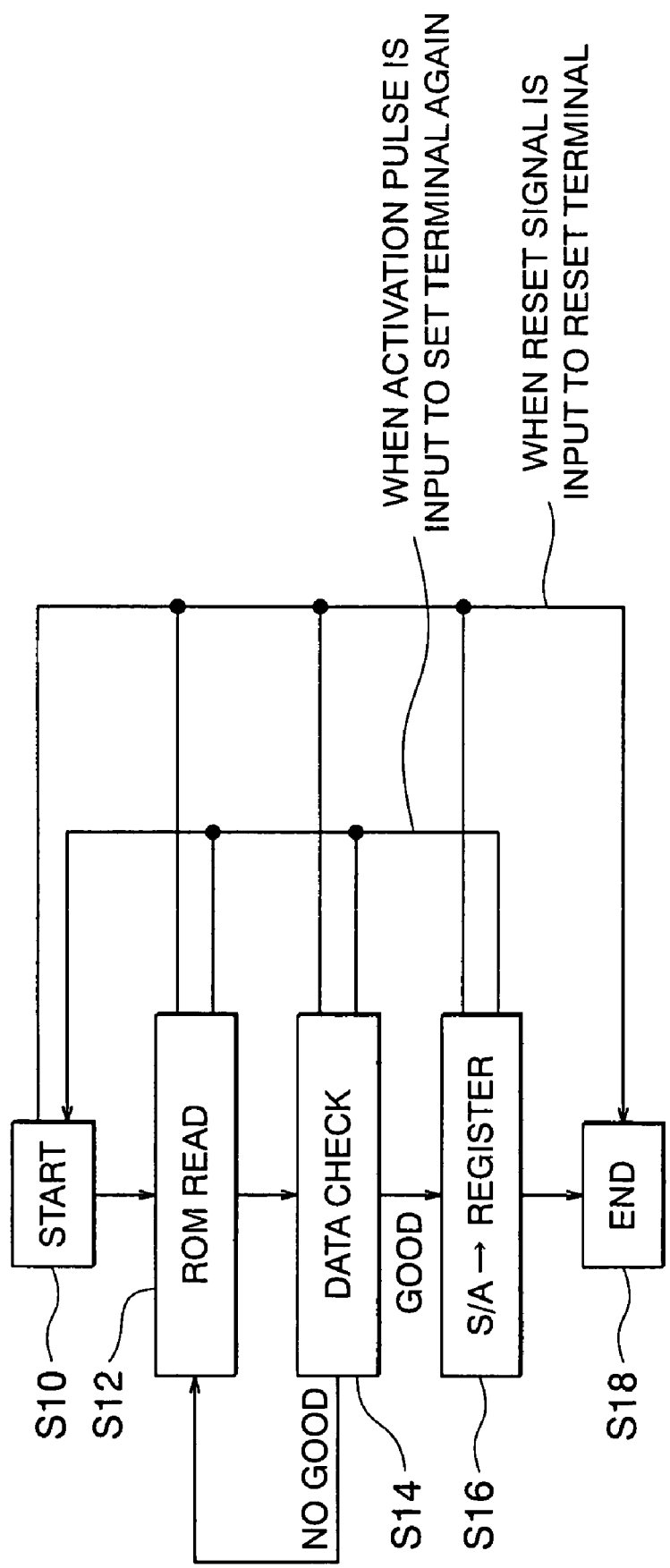
FIG. 6 is a flow chart showing the procedure of ROM read in the fourth embodiment.

The control flow of ROM read in the ROM read controller RRC is as shown in FIG. 6.

When the activation pulse is input to the set terminal Set of this ROM read controller RRC, the control operation is started in step S10.

In step S12, ROM read is performed.

In step S14, the readout data is checked. If the data has no defect, the flow advances to step S16. If the data has a defect, the flow returns to step S12 to perform ROM read again.

If the data has no defect, the flow advances to step S16 to amplify this data by a sense amplifier S/A, read out the amplified data, and hold the readout data in a fuse register FRG. The flow then advances to step S18 to complete the control operation.

If the activation pulse is input to the set terminal Set again in any of steps S12, S14, and S16, the flow returns to step S10 to repeat the above process.

On the other hand, if a reset signal input to a reset terminal/Reset in any of steps S12, S14, and S16, the flow advances to step S18 to complete the control operation.

Accordingly, after the power source is turned on, the power source voltage VCC reaches the power-on detection level, and the pulse generator PG11 generates a pulse. When this activation pulse ROMRDSTT is input to the set terminal Set of the ROM read controller RRC, the control operation is started in step S10. If a ROM read command is input while ROM read is performed in step S12, the pulse generator PG21 also generates a pulse. When this activation pulse ROMRDSTT is input to the set terminal Set of the ROM read controller RRC, the control operation is started from step S10 again.

In this embodiment, ROM read is automatically activated when the power source reaches the detection level after the power source is turned on. However, ROM read can also be performed by inputting a command. Therefore, ROM read can be activated either automatically or by inputting a command in accordance with the user's specifications without changing the circuit. Also, while ROM read is already activated automatically, ROM read can be reactivated by inputting a command. This obviates the need to define the command input timing, so any specifications can be flexibly set.

(5) Fifth Embodiment

Figure 7:
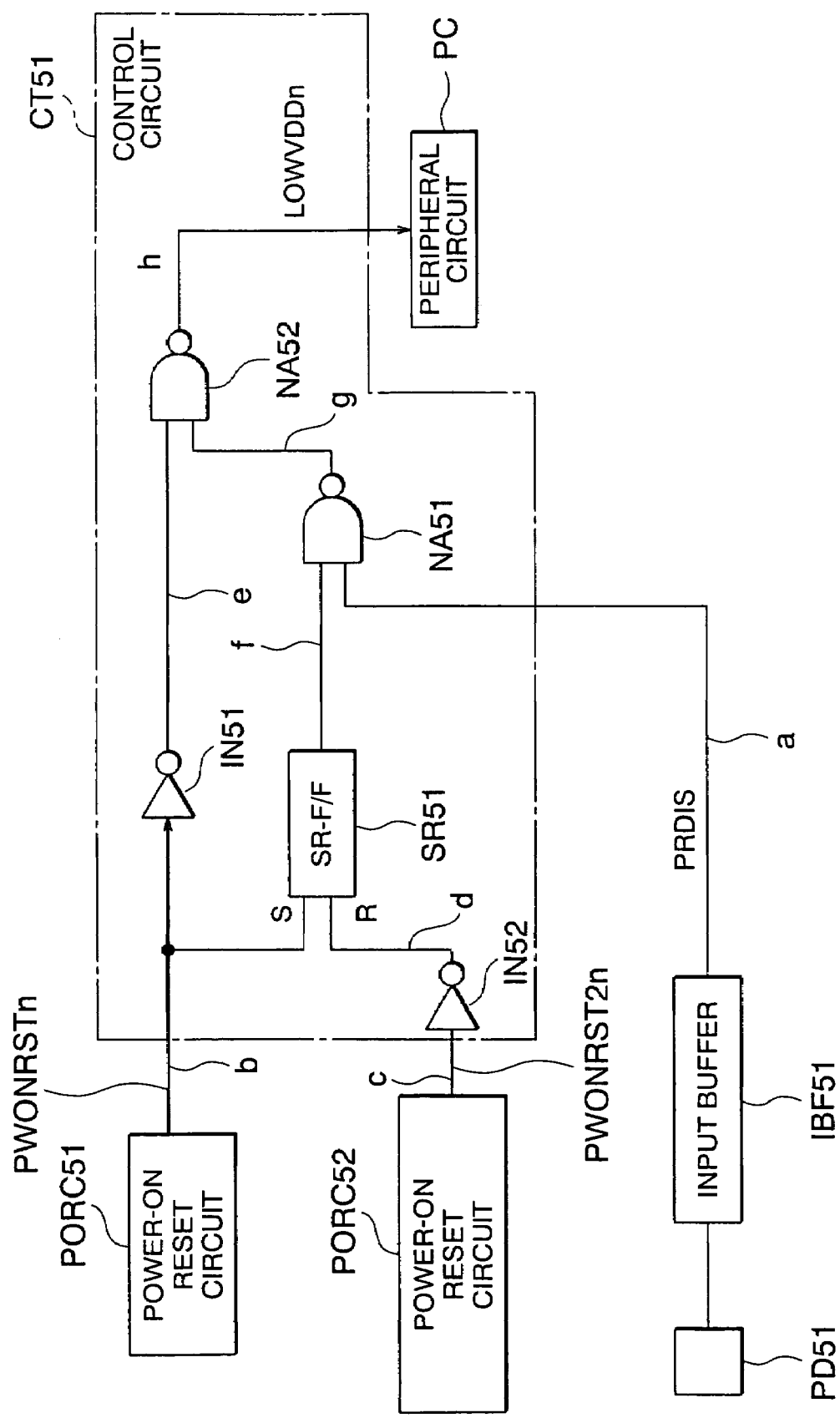
FIG. 7 is a block diagram showing the arrangement of the fifth embodiment of the present invention.

FIG. 7 shows the arrangement of the fifth embodiment of the present invention.

Figure 23:
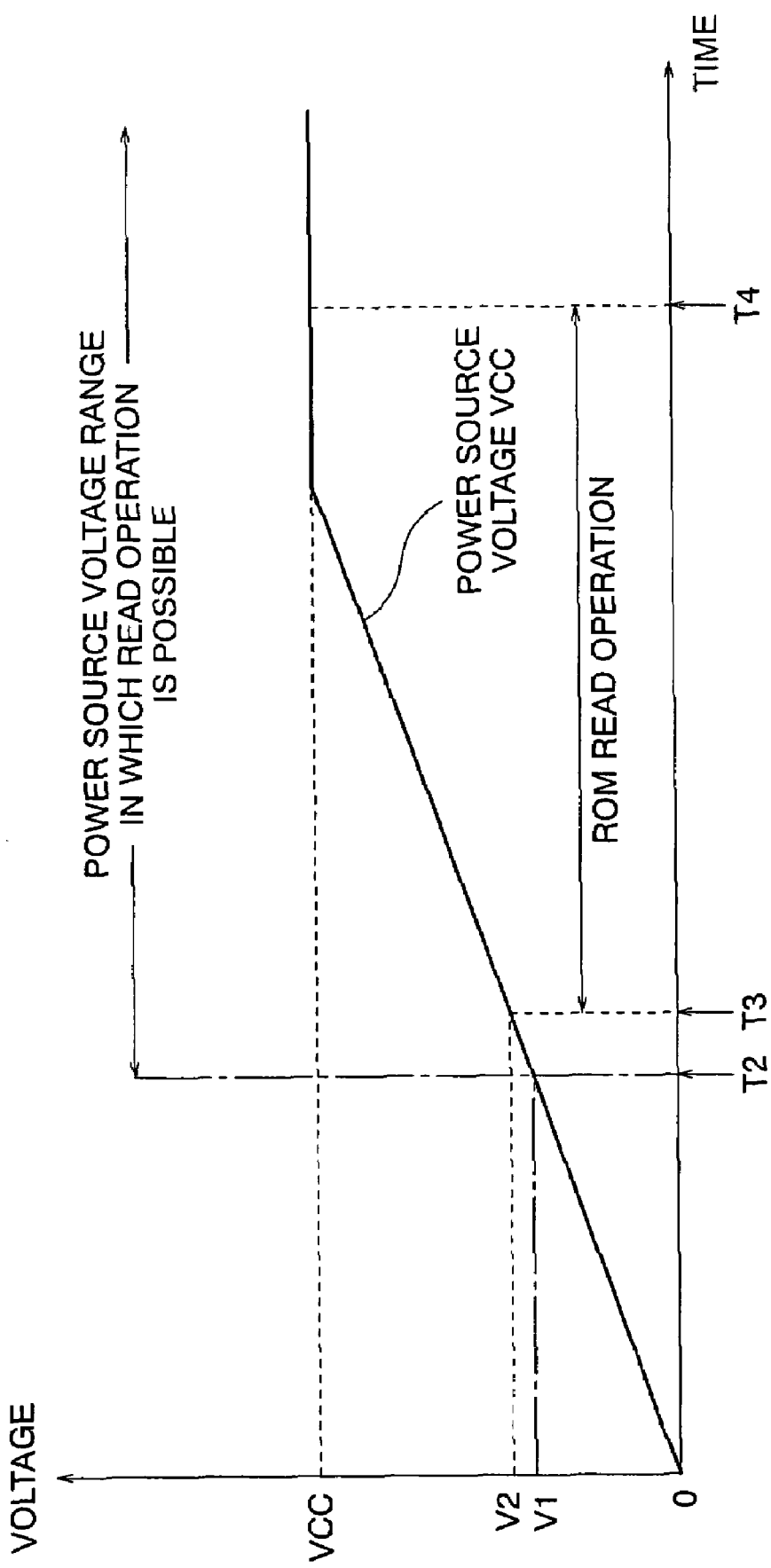
FIG. 23 is a graph for explaining the relationship between the power source voltage and ROM read operation in the conventional nonvolatile semiconductor memory.
Figure 24:
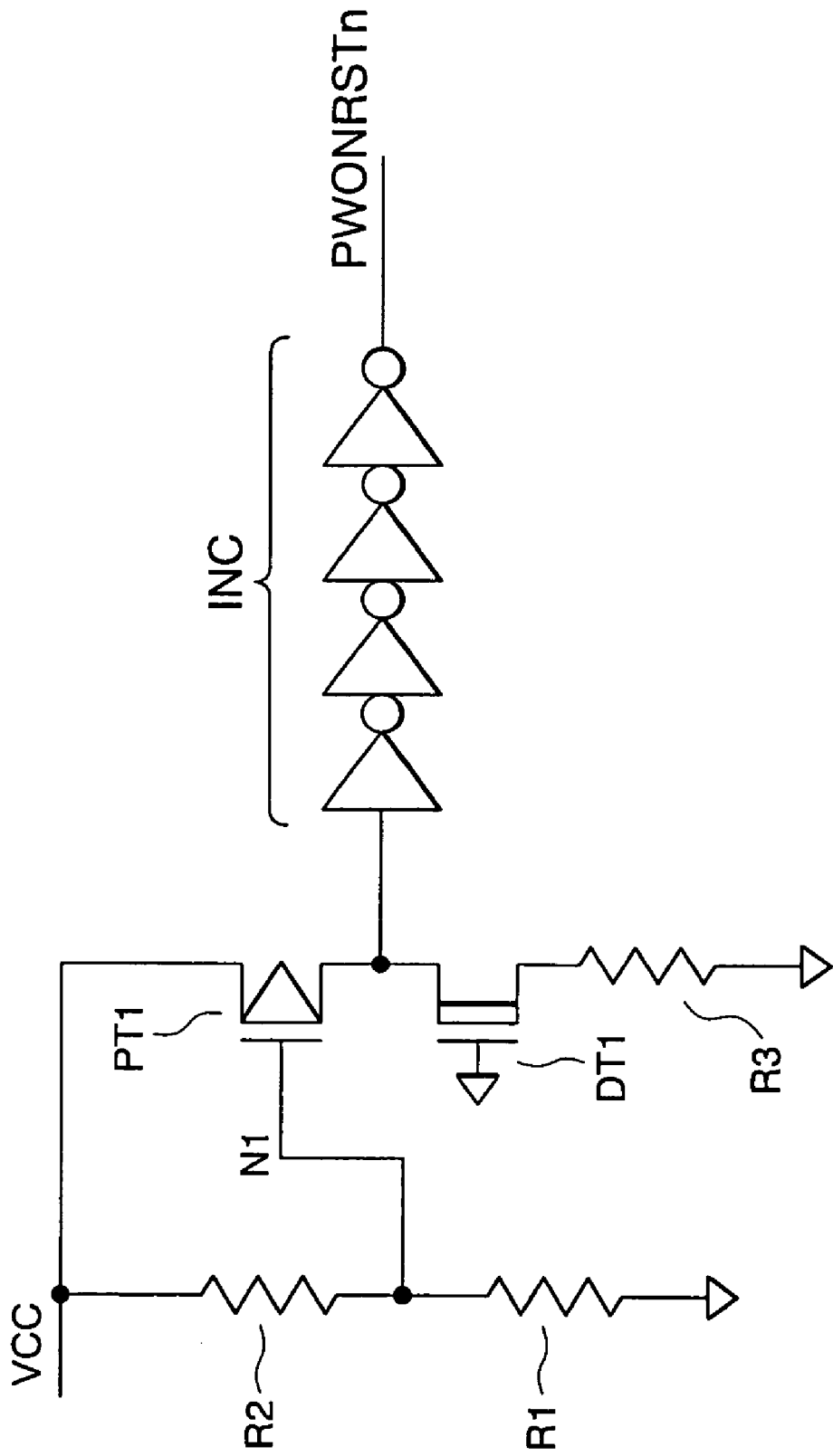
FIG. 24 is a block diagram showing the configuration of a power-on reset circuit in the memory shown in FIG. 22.

As described above, ROM read errors have a relationship with a minimum operating voltage V1 shown in FIG. 23 at which read operation is possible. This embodiment is effective to check this minimum operating voltage V1 when a ROM read error occurs.

This embodiment includes two power-on reset circuits PORC51 and PORC52, an input buffer IBF51, and a control circuit CT51.

Figure 8:
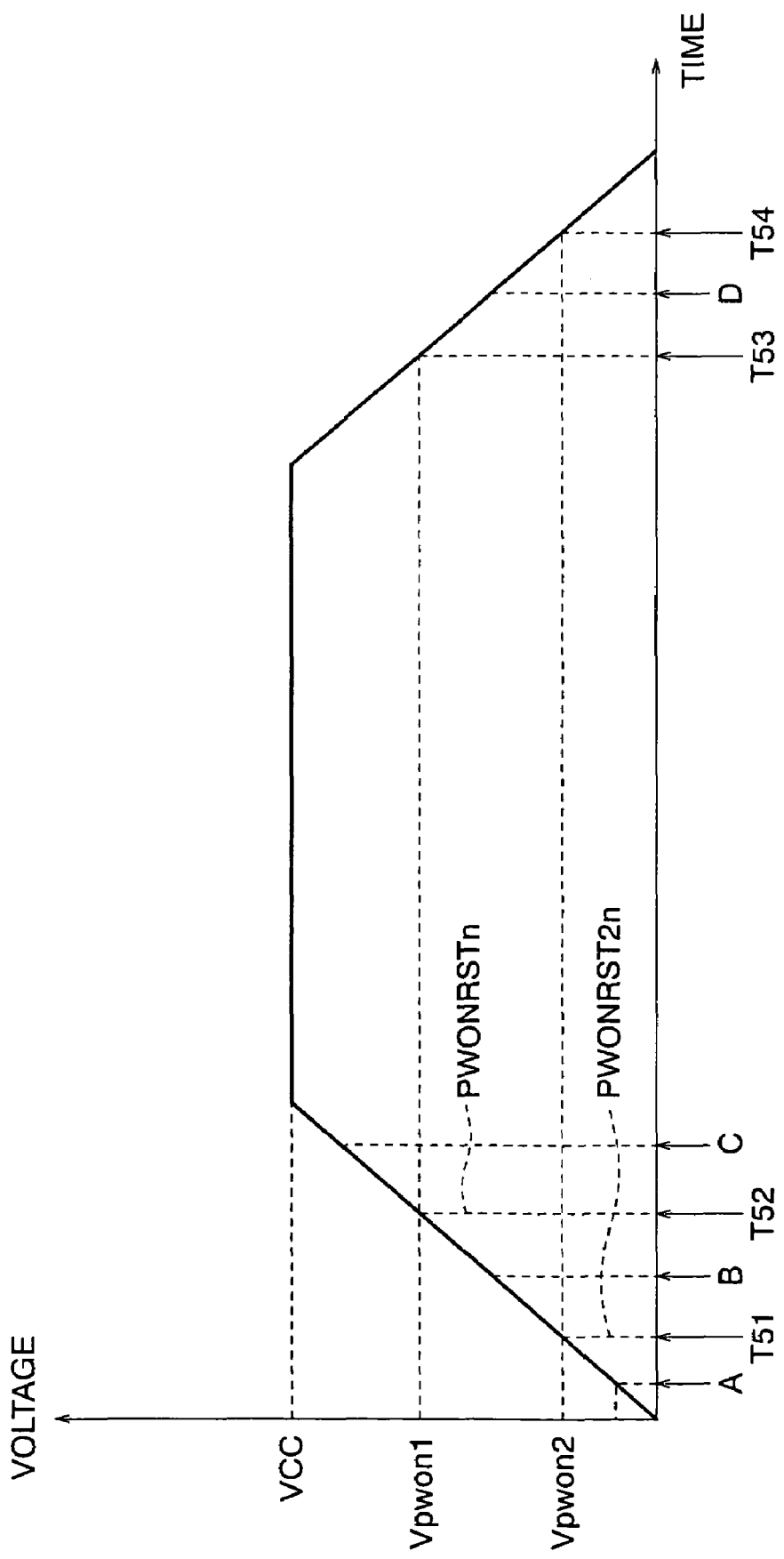
FIG. 8 is a graph for explaining the relationship between the level of a power source voltage and power-on reset signal in the fifth embodiment.

As shown in FIG. 8, when a power source voltage VCC rises and reaches a voltage Vpwon2 at time T51 after the power source is turned on, the power-on reset circuit PORC52 outputs a high-level, power-on reset signal PWONRST2n. The voltage Vpwon2 is set to be lower than a power-on detection level Vpwon1 at which a normal power-on reset signal PWONRSTn changes from low level to high level. When the power source voltage rises and reaches the voltage Vpwon1 at time T52, the power-on reset circuit PORC51 outputs a high-level, power-on reset signal PWONRSTn. The voltage Vpwon1 is set at the same level as a normal power-on detection level.

To activate a ROM read, a low-level voltage PRDIS is input to an input pad PD51. To inhibit this ROM activation, a high-level voltage PRDIS is input to the input pad PD51. The input buffer IBF51 amplifies and outputs this voltage PRDIS.

The control circuit CT51 includes inverters IN51 and IN52, an SR flip-flop SR51, and NAND gates NA51 and NA52.

The SR flip-flop SR51 is reset when the low-level, power-on reset signal PWONRST2n which is inverted is input to a reset terminal R, and is set when the high-level, power-on reset signal PWONRSTn is supplied to a set terminal S. The output from this SR flip-flop SR51 is input to one input terminal of the NAND gate NA51. The output voltage PRDIS from the input buffer IBF51 is input to the other input terminal of the NAND gate NA51. The result of the NAND operation is input to one input terminal of the NAND gate NA52. The power-on reset signal PWONRSTn is inverted by the inverter IN51, and this inverted signal is supplied to the other input terminal of the NAND gate NA52. The result of the NAND operation is output to a peripheral circuit PC.

The operation of this embodiment with the above arrangement will be explained below.

As shown in FIG. 8, assume that the power source voltage rises, reaches the VCC level, and then drops. That is, assume that, after the power source is turned on, the power source voltage level is lower than the voltage Vpwon2 at time A, is higher than this voltage Vpwon2 but has not reached the voltage Vpwon1 as the power-on detection level at time B, exceeds the voltage Vpwon1 at time C, and then drops to be lower than the voltage Vpwon1 but higher than the voltage Vpwon2 at time D.

Figure 9:
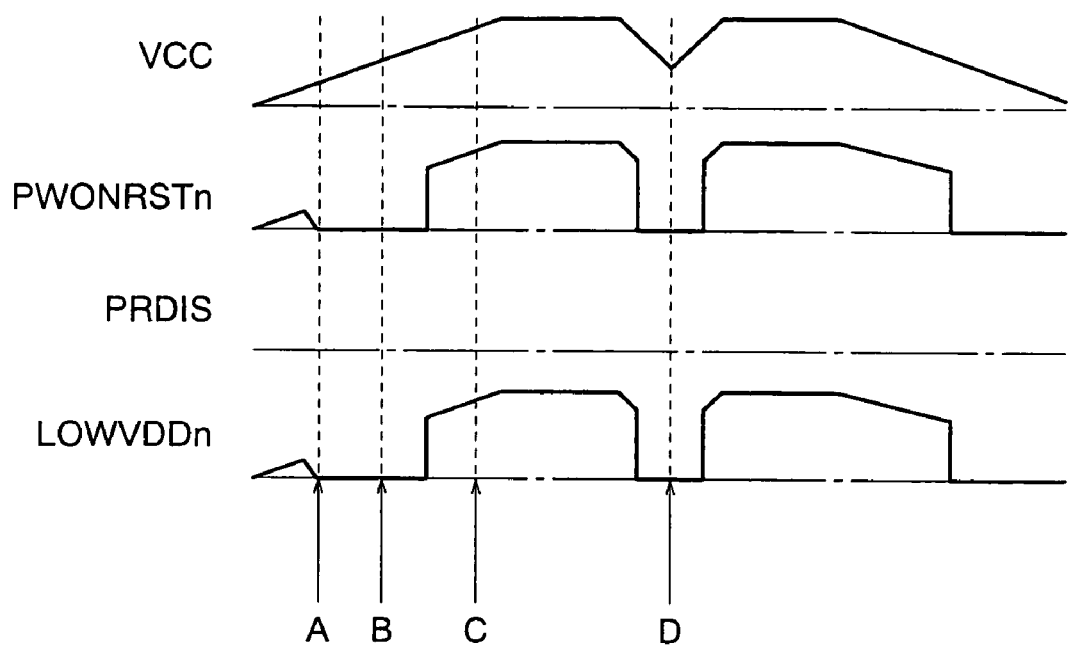
FIG. 9 is a timing chart showing operating waveforms in the fifth embodiment.
Figure 10:
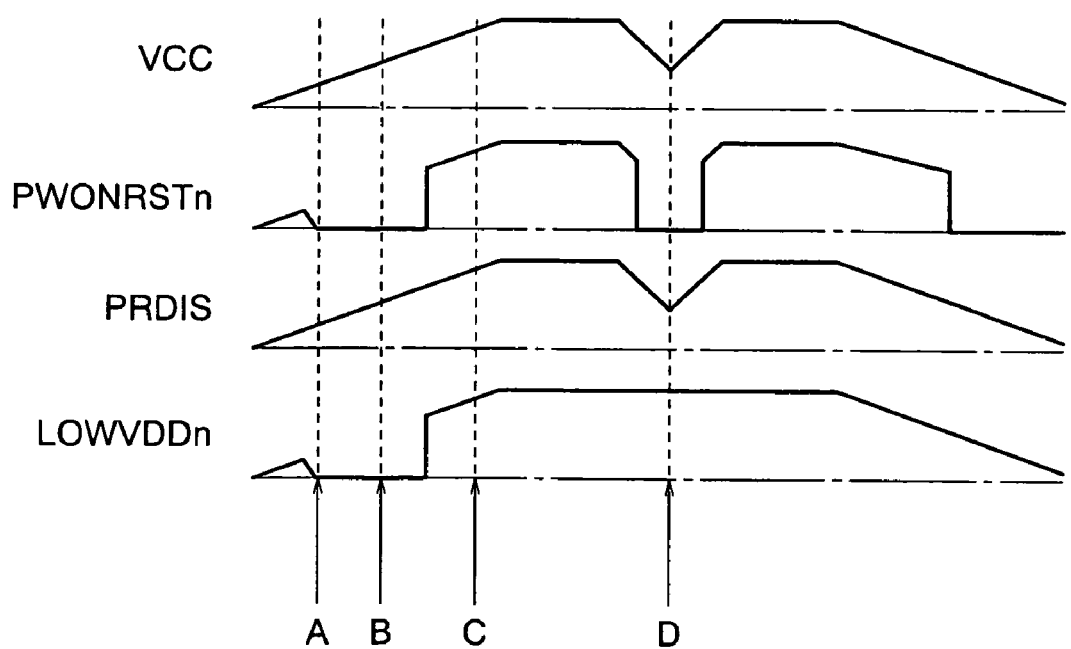
FIG. 10 is a timing chart showing operating waveforms in the fifth embodiment.

FIG. 9 shows changes in the power-on detection level PWOWRSTn and a reset signal LOWVDDn at times A to B when the power source voltage VCC rises and falls while the voltage PRDIS is fixed to low level. FIG. 10 shows changes in the power-on detection level PWONRSTn and reset signal LOWVDDn at times A to D when the power source voltage VCC rises and falls while the voltage PRDIS is changed to high level along with the rise of the power source voltage VCC.

Figure 11:
FIG. 11 is a view for explaining the level of each signal in the fifth embodiment.
Figure 12:
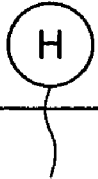
FIG. 12 is a view for explaining the level of each signal in the fifth embodiment.

Furthermore, letting a be the output level (voltage PRDIS) of the input buffer IBF51, b be the output level (power-on reset signal PWONRSTn) of the power-on reset circuit PORC51, c be the output level (power-on reset signal PWONRST2n) of the power-on reset circuit PORC52, d be the output level of the inverter IN52, which is obtained by inverting the output level of the power-on reset circuit PORC52, e be the output level of the inverter IN51, which is obtained by inverting the output level of the power-on reset circuit PORC51, f be the output level of the SR flip-flop SR51, g be the output level of the NAND gate NA51, and h be the output level (reset signal LOWVDDn) of the NAND gate NA52. FIG. 11 shows these output levels a to h when the voltage PRDIS is fixed to low level. FIG. 12 shows the output levels a to h when the voltage PRDIS is changed to high level along with the rise of the power source voltage VCC.

At time D, the power source voltage which has once exceeded the voltage Vpwon1 drops to be lower than the voltage Vpwon1 but higher than the voltage Vpwon2. When the voltage PRDIS is fixed to low level, as shown in FIG. 11, the reset signal LOWVDDn (output level h) changes from high level to low level, and this low-level signal is supplied to the peripheral circuit PC to reset it.

On the other hand, if the voltage PRDIS is at high level, as shown in FIG. 12, the reset signal LOWVDDn (output level h) maintains high level as at time C, so no reset is performed.

In this embodiment as described above, when the power source voltage VCC rises to reach the Vpwon1 equal to the power-on detection level, the high-level, power-on reset signal PWONRSTn is output, and the reset signal LOWVDDn is output. After that, this reset signal LOWVDDn is not output again unless the power source voltage becomes lower than the second detection level Vpwon2 which is lower than the first detection level Vpwon1. Therefore, only when the power source voltage reaches the first power-on detection level, the low-level reset signal LOWVDDn can be output to reset the peripheral circuit PC.

The voltage Vpwon2 detected by the power-on reset circuit PORC52 is set at the minimum logic circuit operating voltage V1 at which the device can operate. Therefore, even when the power source voltage VCC lowers after reaching a power-on detection level V2 for the first time, the device is not reset if the voltage is equal to or higher than the minimum logic circuit operating voltage V1. Accordingly, the operating state of the device can be tested at a level at which the power source voltage VCC is equal to or higher than the minimum logic circuit operating voltage V1. In other words, the minimum operating voltage of the device can be checked.

(6) Sixth Embodiment

Figure 13:
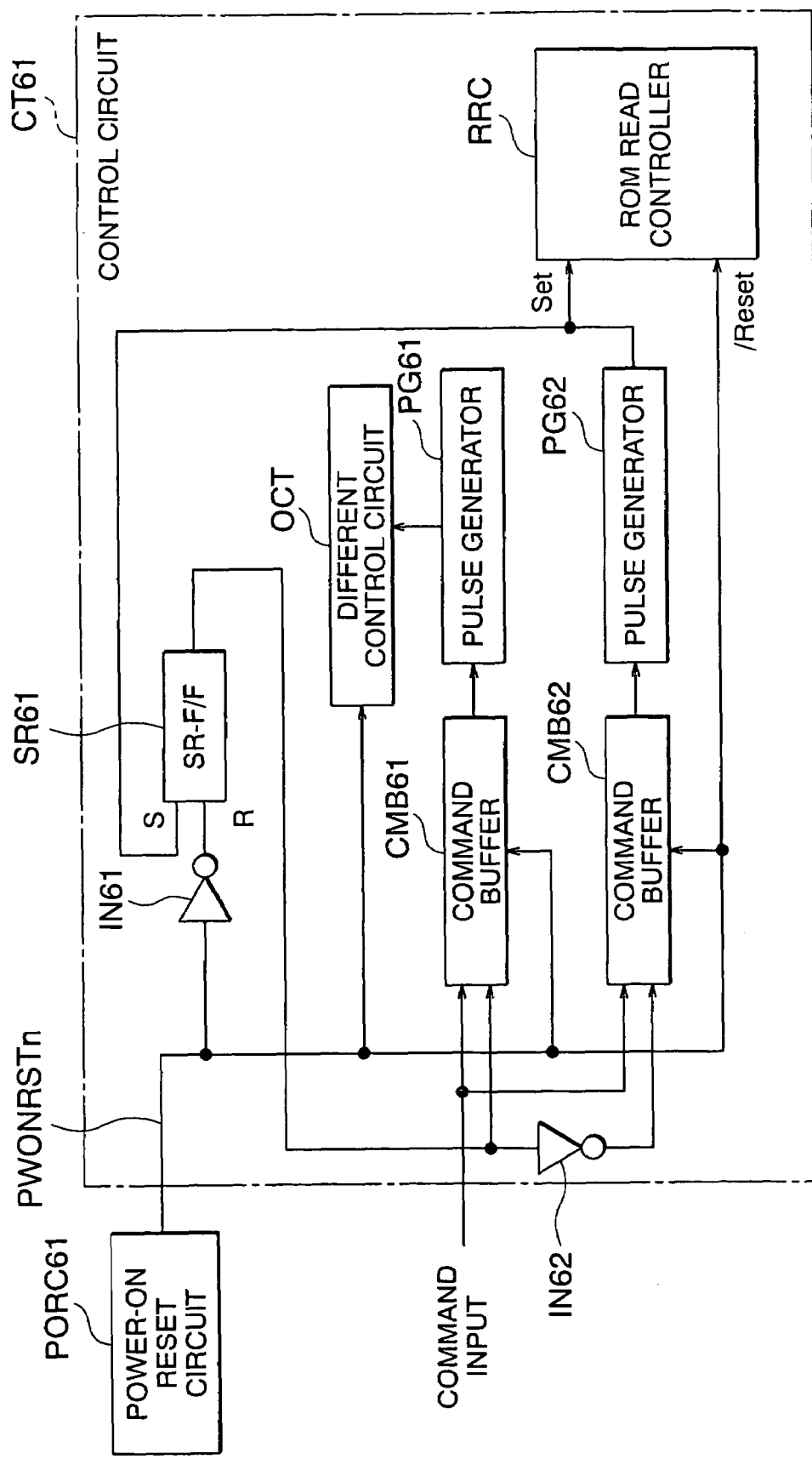
FIG. 13 is a block diagram showing the arrangement of the sixth embodiment of the present invention.

The sixth embodiment of the present invention will be explained below with reference to FIG. 13 showing its arrangement. This embodiment includes a power-on reset circuit PORC61 and control circuit CT61. The control circuit CT61 has inverters IN61 and IN62, an SR flip-flop SR61, a different control circuit OCT, command buffers CMB61 and CMB62, pulse generators PG61 and PG62, and a ROM read controller RRC. This embodiment is characterized in that a command for a certain purpose, e.g., a reset command, is also used as a ROM read activation command. The embodiment will be explained by taking a case in which a reset command is also used as a ROM read activation command as an example.

When a reset command is input during a normal operation, a circuit in operation is initialized (e.g., a register of a peripheral circuit is reset). In this embodiment, however, if this reset command is input immediately after the power source is turned on, the command is interpreted as a ROM read activation command, so ROM read is started. Whether to interpret this reset command as the ROM read activation command is determined in accordance with the state of the SR flip-flop SR61.

That is, before a power source reaches the detection level after the power source is turned on, the power-on reset circuit PORC61 outputs a low-level, power-on reset signal PWONRSTn. This low-level, power-on reset signal PWONRSTn is inverted by the inverter IN61 and input to a reset terminal R of the SR flip-flop SR61 to reset it. The low-level, power-on reset signal PWONRSTn is also input to the different control circuit OCT, the command buffers CMB61 and CMB62, and a reset terminal/Reset of the ROM read controller RRC to reset these circuits and buffers.

When the SR flip-flop SR61 is reset, a buffer selection signal output from this SR flip-flop SR is at a first level (e.g., low level). This first-level buffer selection signal is supplied to the command buffer CNB61 to render it unselected. The selection signal is also inverted into a second level (e.g., high level) by the inverter IN62, and this second level is input to the command buffer CMB62 to select it.

In this state, the reset command is interpreted as the ROM read activation command. The input reset command is supplied to the command buffers CMB61 and CMB62 and output after being held in the selected command buffer CMB62. The output command is supplied to the pulse generator PG62 to generate an activation pulse. This activation pulse is input to a set terminal Set of the ROM read controller RRC to activate ROM read.

Once ROM read is activated, the activation pulse is input to a set terminal S of the SR flip-flop SR61 to set it. Accordingly, the output command selection signal from this shift register SR switches to the second level. When this selection signal is input to the command buffer CMB61, this command buffer CMB61 is selected. When the inverted, first-level buffer selection signal is input to the command buffer CMB62, this command buffer CMB62 is not selected.

When the reset command is input to the command buffers CMB61 and CMB62 in this state, this reset command is not output from the command buffer CMB62, so no activation pulse is generated from the pulse generator PG62. On the other hand, the reset command is output from the command buffer CMB61 to the pulse generator PG61, and a signal for reset is supplied to the different control circuit OCT. The different control circuit OCT outputs control signals necessary for reset to individual circuits, thereby resetting these circuits.

In this embodiment, an already used command such as a reset command is also used as a ROM read activation command. Therefore, no dedicated ROM read activation command need be generated Also, when a reset command is used to activate ROM read as in this embodiment, if the existing product specification recommends a user to input a reset command immediately after the power source is turned on, it is unnecessary to newly recommend the user to input a ROM read activation command. That is, by recommending inputting of a reset command as defined in the existing specifications, compatibility can be obtained between the operation of the existing product and the activation of ROM read in this embodiment.

In this embodiment as described above, whether to perform initialization such as ROM read is determined in accordance with an external voltage. Therefore, if an operation error occurs, the operation can be performed without any initialization. This makes it possible to check whether the operation error is caused by initialization or another portion, and to locate the defective portion. In addition, when initialization is to be performed after an external command is input, it is possible to prevent initialization errors caused by voltage fluctuations when initialization is automatically activated after the power source is turned on.

The arrangement and operation when the first, third, or fifth embodiment described above is used as a multi-chip will be explained below.

Figure 14A:
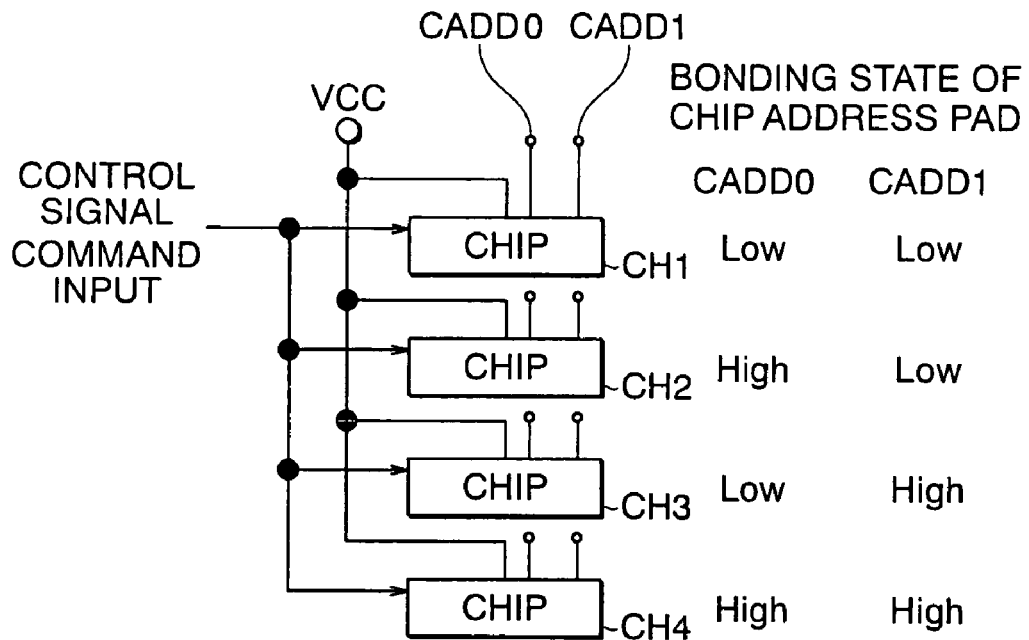
FIGS. 14A and 14B are block diagrams showing an arrangement when the first, third, or fifth embodiment is used as a multi-chip.
Figure 14B:
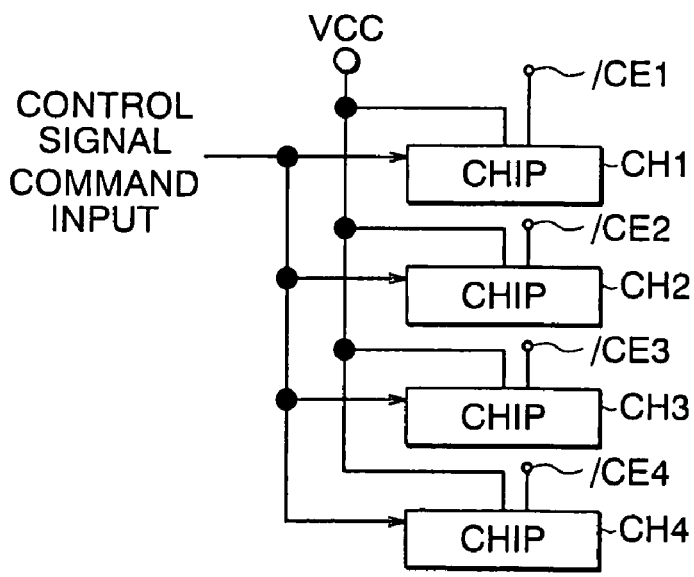

FIGS. 14A and 14B show the configuration of a system formed as a multi-chip mode. A plurality of chips CH1 to CH4 are arranged each of which is equipped with the first, third, or fifth embodiment having an input pad to which a voltage PRDIS is applied. The number of chips can be any arbitrary number which is two or more.

Each of these chips CH1 to CH4 has a power source voltage VCC terminal to which a power source voltage VCC is supplied, a control terminal to which a control signal is input, and an I/O terminal through which various signals such as commands and data are input and output. These terminals are so connected as to be shared by the chips CH1 to CH4.

A multi-chip mode system configuration has two methods. One is a method as shown in FIG. 14A in which CADD pads are used to discriminate the individual chips by comparing an input chip address from the I/O pad with wire bonding information from the CADD pad. The other is a method as shown in FIG. 14B in which only /CE (Chip Enable) pads are individually driven to operate only a chip whose /CE is Low.

Each of the chips CH1 to CH4 has bonding pads CADD0 and CADD1 to which a chip address voltage indicating the chip address is applied. A low-level voltage is applied to both the bonding pads CADD0 and CADD1 of the chip CH1. High- and low-level voltages are applied to the bonding pads CADD0 and CADD1, respectively, of the chip CR2. Low- and high-level voltages are applied to the bonding pads CADD0 and CADD1, respectively, of the chip CH3. A high-level voltage is applied to both the bonding pads CADD0 and CADD1 of the chip CH4.

To select one chip and operate the selected chip by inputting a command to it, the chip address of this chip is input to the chips CH1 to CH4. If chip addresses CADD0 and CADD1 both of which are at low level are input to the chips CH1 to CH4, the chip CH1 is selected. If a low-level chip address CADD0 and high-level chip address CADD1 are input to the chips CH1 to CH4, the chip CH3 is selected.

In the conventional devices, however, when the power source is turned on, ROM read is automatically performed in all the chips CH1 to CH4. As shown in FIG. 15A, the power source voltage VCC gradually rises after the power source is turned on. As shown in FIG. 15B, the power source voltage VCC terminal is shared by the chips CH1 to CH4, so ROM read is automatically performed in these chips CH1 to CH4 when the power source is turned on. After this ROM read is complete, a chip address is input to select a chip, and the selected chip is operated by inputting a command such as a read, write, or erase command to it.

Figure 16A:
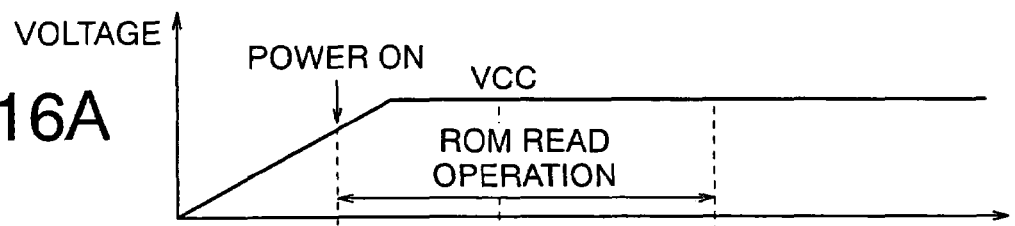
FIGS. 16A and 16B are graphs showing changes in the power source voltage and current consumption in the arrangement shown in FIGS. 14A and 14B.
Figure 16B:
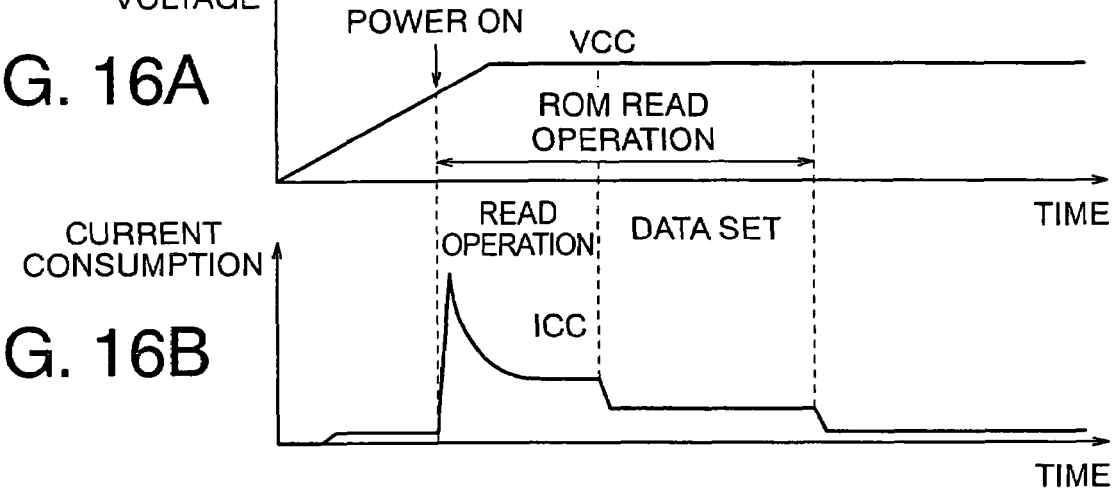

If ROM read is automatically activated after the power source is turned on as shown in FIG. 16A, a peak current is consumed in the initial stages of this ROM read period as shown in FIG. 16B. For example, when the four chips CH1 to CH4 are formed as in this system, a peak current four times as large as the peak current of one chip is consumed.

Depending on the type of system, however, it is impossible to supply power obtained by multiplying the peak current of one chip by the number of chips, e.g., it is sometimes possible to supply power only twice as large as the peak current. In this case, the power source voltage drops when the peak current is generated. This may reset the system to make normal ROM read impossible to perform.

Figure 17A:
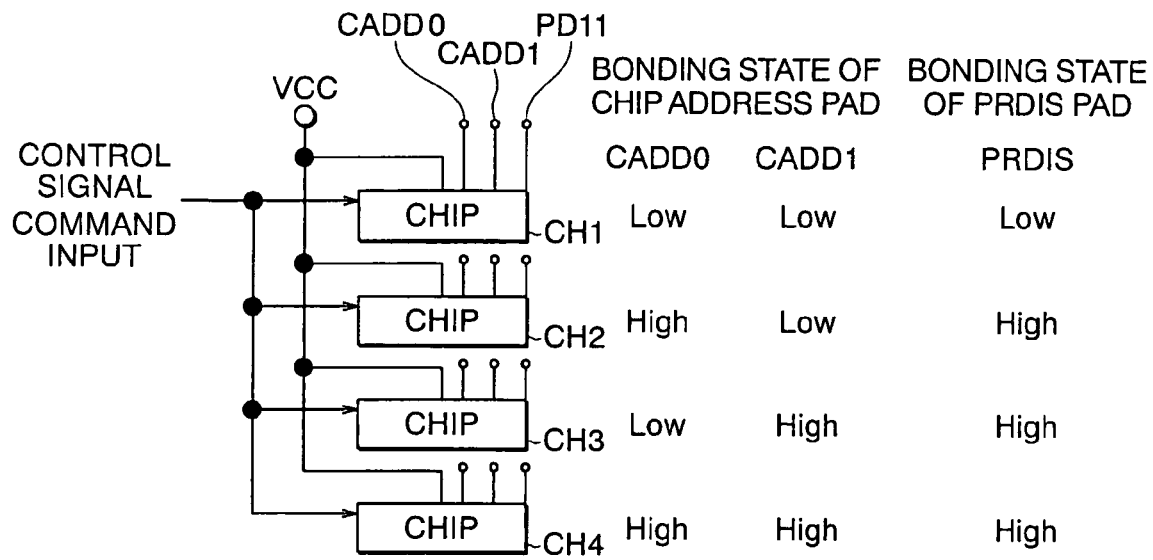
FIGS. 17A and 17B are block diagrams showing an arrangement when the first, third, or fifth embodiment is used as a multi-chip.
Figure 17B:
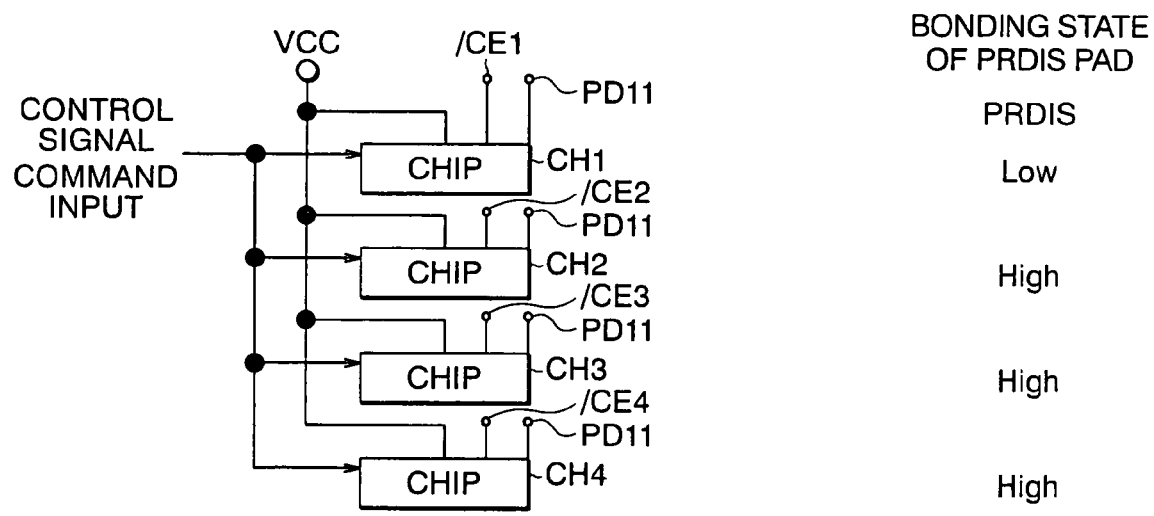

FIGS. 17A and 17B show the configuration of a system which includes, in order to avoid the above event, a plurality of chips CH1 to CH4 each of which is a chip of the first, third, or fifth embodiment described above. In this system, each of the chips CH1 to CH4 further includes an input pad PD11 described previously in the first, third, or fifth embodiment, unlike in the system shown in FIGS. 14A and 14B. When a low-level voltage is applied to this input pad PD11, ROM read is automatically performed after the power source is turned on. When a high-level voltage is applied to the input pad PD11, no automatic ROM read is performed after the power source is turned on.

In this system shown in FIGS. 17A and 17B, a low-level voltage is input to the input pad PD11 of only the chip CH1, and a high-level voltage is applied to the input pads PD11 of the remaining chips CH2 to CH4.

Consequently, as shown in FIGS. 18A and 18B, only the chip CH1 performs automatic ROM read after the power source is turned on. After that, chip addresses are input to the remaining chips CH2 to CH4 at different timings to select these chips, and a command for activating ROM read is input to the chips to cause them to perform ROM read. Since peak currents do not simultaneously flow through a plurality of chips, a lowering of the power source voltage is prevented, so ROM read can be normally performed.

As described above, in the multi-chip system, the voltage PRDIS to be applied to the input pad PD11 of the first, third, or fifth embodiment is set at low or high level. This prevents operation errors occurring when the power source voltage drops owing to the peak current necessary for ROM read.

As the seventh embodiment of the present invention, an electric card using the semiconductor device or nonvolatile semiconductor memory according to the first to sixth embodiments of the present invention and an electric device using this electric card will be described below.

(7) Seventh Embodiment

Figure 19:
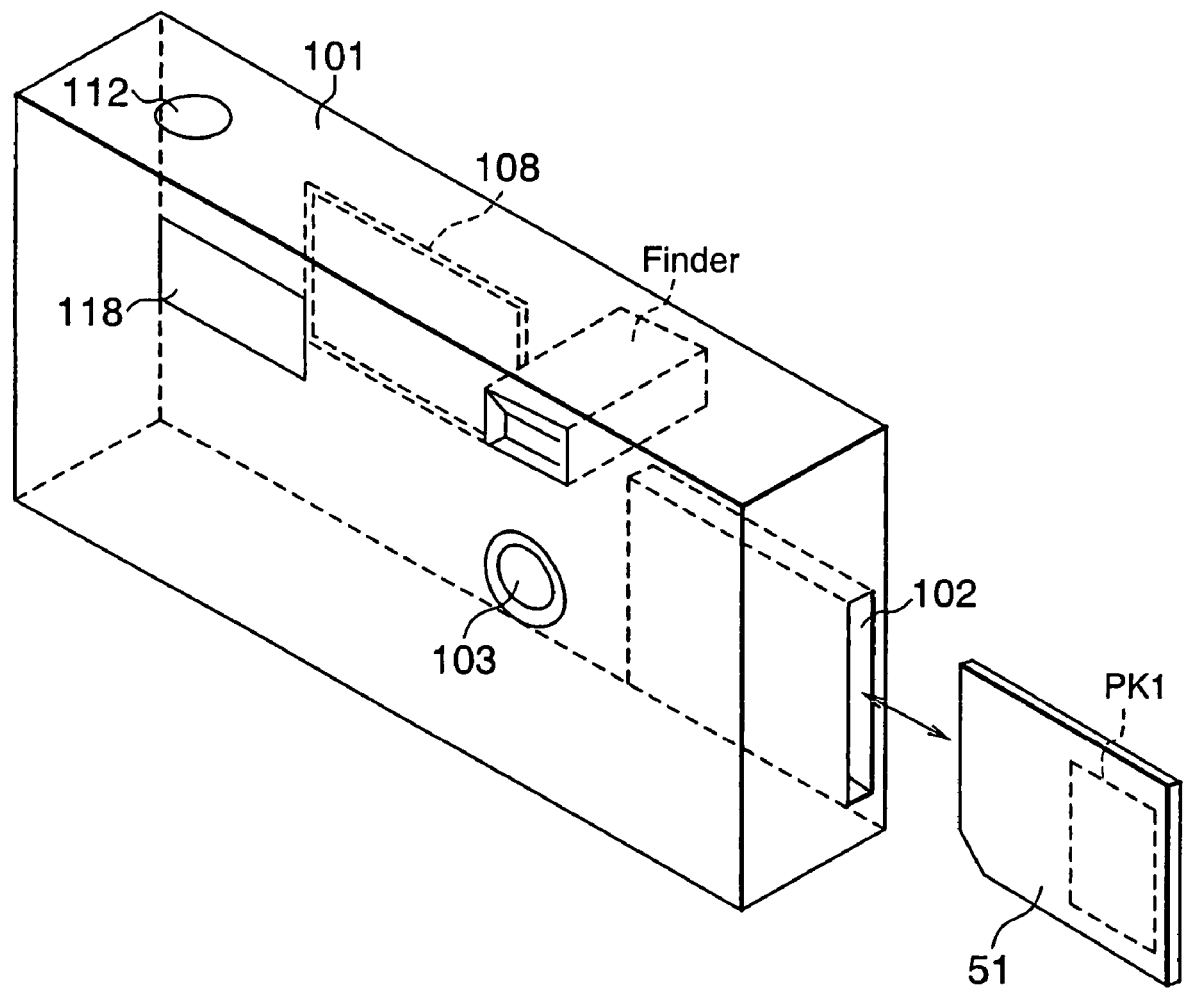
FIG. 19 is a block diagram showing an electric card and the arrangement of an electric device with which the electric card can be used according to the seventh embodiment.

FIG. 19 shows an electric card according to the seventh embodiment and the arrangement of an electric device using this electric card.

This electric device is a digital still camera as an example of portable electric devices. The electric card is a memory card 51 used as a recording medium of a digital still camera 101. This memory card 51 incorporates an IC package PK1 in which the semiconductor device or nonvolatile semiconductor memory according to the first to third embodiments described above is integrated or encapsulated.

The case of the digital still camera 101 accommodates a card slot 102 and a circuit board (not shown) connected to this card slot 102.

The memory card 51 is detachably inserted in the card slot 102 of the digital still camera 101. When inserted in this card slot 102, the memory card 51 is electrically connected to electronic circuits on the circuit board.

If this electric card is a non-contact-type IC card, the electric card is electrically connected to the electronic circuits on the circuit board by radio signals when inserted in or approached to the card slot 102.

Figure 20:
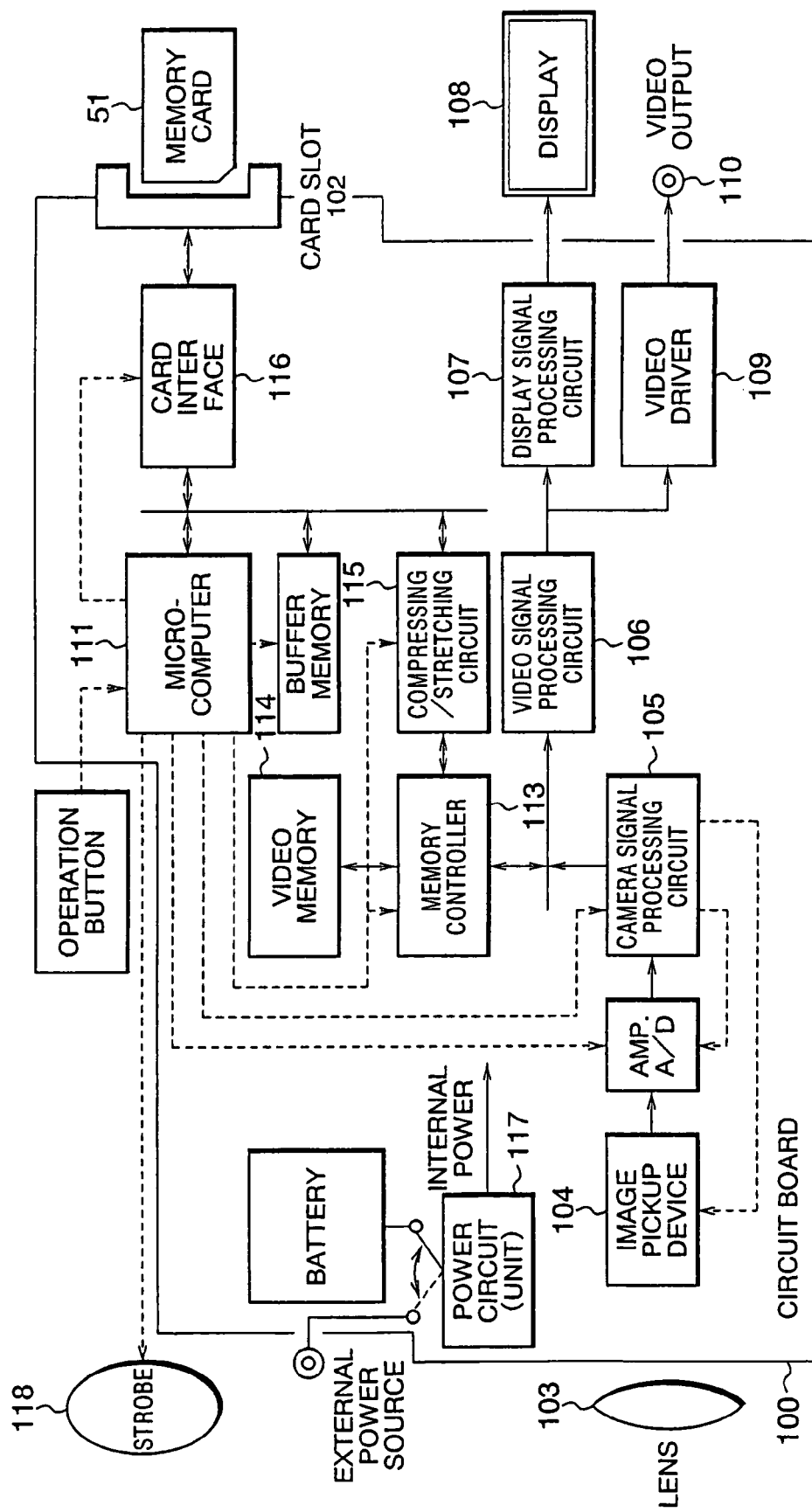
FIG. 20 is a block diagram showing the arrangement of the electric device.
Figure 21A:
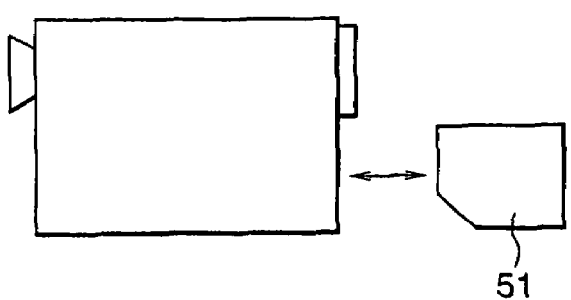
FIGS. 21A to 21J are views for explaining practical examples of the electric device.
Figure 21F:
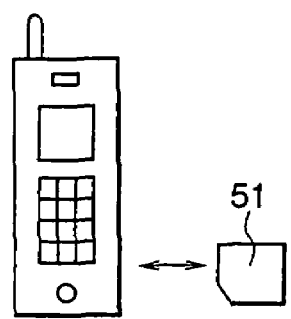
Figure 21B:
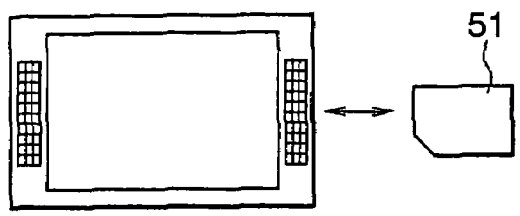
Figure 21G:
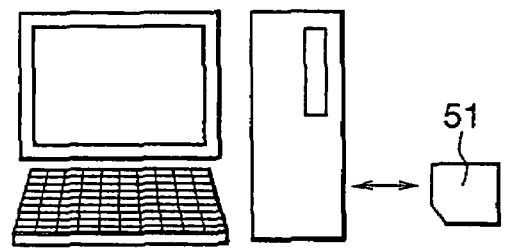
Figure 21C:
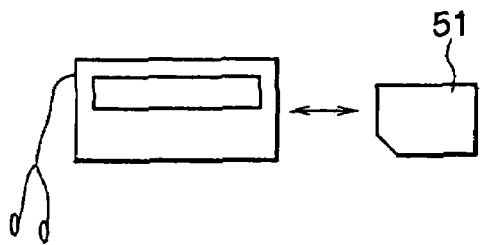
Figure 21H:
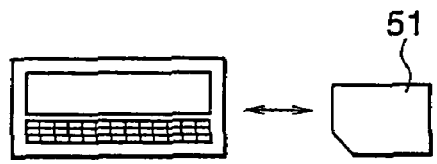
Figure 21D:
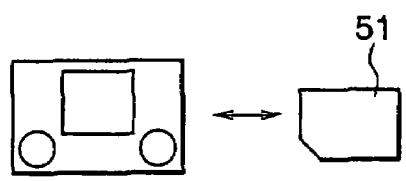
Figure 21I:
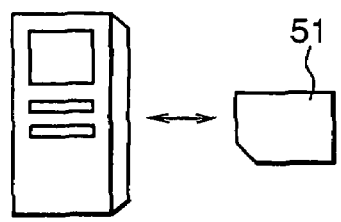
Figure 21E:
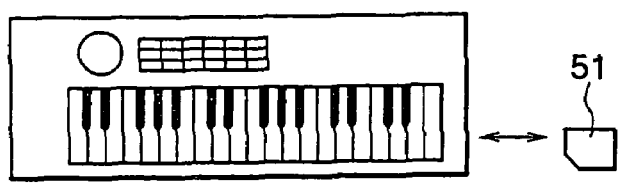
Figure 21J:
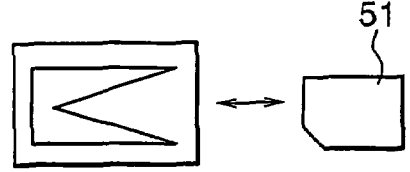

FIG. 20 shows the basic arrangement of the digital still camera.

Light from an object is converged by a lens 103 and input to an image pickup device 104. This image pickup device 104 is, e.g., a CMOS sensor and photoelectrically converts the input light to output, e.g., an analog signal. This analog signal is amplified by an analog amplifier (AMP) and converted into a digital signal by an A/D converter. The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera signal processing circuit 105 is input to a video signal processing circuit 106 and converted into a video signal. The system of this video signal is e.g., NTSC (National Television System Committee).

The video signal is output to a display 108 attached to the digital still camera 101, via a display signal processing circuit 107. This display 108 is, e.g., a liquid crystal monitor.

The video signal is supplied to a video output terminal 110 via a video driver 109. An image picked up by this digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. Accordingly, the microcomputer 111 controls a memory controller 113 to write the output signal from the camera signal processing circuit 105 into a video memory 114 as a frame image. This frame image written in the video memory 114 is compressed on the basis of a predetermined compression format by a compressing/stretching circuit 115. The compressed image is recorded, via a card interface 116, on the memory card 51 inserted in the card slot.

To reproduce a recorded image, an image recorded on the memory card 51 is read out via the card interface 116, stretched by the compressing/stretching circuit 115, and written in the video memory 114. The written image is input to the video signal processing circuit 106 and displayed on the display 108 or another image apparatus in the same manner as when an image is monitored.

In this arrangement, components mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. This power circuit 117 receives power from an external power source or battery and generates an internal power source voltage used inside the digital still camera 101. For example, a DC-DC converter can be used as this power circuit 117. The internal power source voltage is supplied to the individual circuits described above and to a strobe 118 and the display 108.

As described above, the electric card according to this embodiment can be used in portable electric devices such as the digital still camera explained above. However, this electric card can also be used in various apparatuses such as shown in FIGS. 21A to 21J, as well as in portable electric devices. That is, the electric card can also be used in a video camera shown in FIG. 21A, a television set shown in FIG. 21B, an audio apparatus shown in FIG. 21C, a game apparatus shown in FIG. 21D, an electric musical instrument shown in FIG. 21E, a cell phone shown in FIG. 21F, a personal computer shown in FIG. 21G, a personal digital assistant (PDA) shown in FIG. 21H, a voice recorder shown in FIG. 21I, and a PC card shown in FIG. 21J.

The aforementioned embodiments are merely examples and hence do not restrict the present invention. Accordingly, these embodiments can be variously modified without departing from the technical scope of the invention.

What is claimed is:

1. A semiconductor memory comprising:
    a read control circuit which, when activated, outputs a control signal for reading out data; and
    an activation control circuit for activating or deactivating said read control circuit in accordance with external input, wherein said activation control circuit has a pad connected to said activation control circuit, and the external input is performed by application of a voltage to said pad,
    wherein said activation control circuit further comprises:
    a power-on reset circuit for outputting a power-on reset signal when a voltage reaches a predetermined level after the power source is turned on; and
    an activation determining circuit which, if the voltage input to said pad is at a first level, activates said read control circuit to output the control signal when the power-on reset signal is output, and, if the voltage input to said pad is at a second level, deactivates said read control circuit so as to not output the control signal even when the power-on reset signal is output.

2. The semiconductor device wherein an electric card is equipped with the semiconductor device defined in claim 1.

3. An electric device comprising:
    a card interface;
    a card slot connected to said card interface; and
    an electric card electrically connected to said card slot, wherein said electric card is equipped with the semiconductor device defined in claim 1.

4. A semiconductor memory comprising:
    a read control circuit which, when activated, outputs a control signal for reading out data; and
    an activation control circuit for activating or deactivating said read control circuit in accordance with external input, wherein the external input is performed by inputting a predetermined command to said activation control circuit, wherein said activation control circuit further comprises:

a power-on reset circuit for outputting a power-on reset signal when a voltage reaches a predetermined level after the power source is turned on; and an activation determining circuit which, while the predetermined command is not input, deactivates said read control circuit regardless of whether the power-on reset signal is output, and, if the predetermined command is input, activates said read control circuit to output the control signal.

5. The semiconductor device wherein an electric card is equipped with the semiconductor device defined in claim 4.

6. An electric device comprising:

a card interface;

a card slot connected so said card interface; and an electric card electrically connected to said card slot, wherein said electric card is equipped with the semiconductor device defined in claim 4.

7. A semiconductor memory comprising:

a read control circuit which, when activated, outputs a control signal for reading out data; and an activation control circuit for activating or deactivating said read control circuit in accordance with external input, wherein said activation control circuit further comprises:

a pad connected to said activation control circuit;

a power-on reset circuit for outputting a power-on reset signal when a voltage reaches a predetermined level after the power source is turned on;

a first activation circuit which, if the voltage input to said pad is at a first level, outputs a first activation signal when the power-on reset signal is output, and, if the voltage input to said pad is at a second level, does not output the first activation signal even when the power-on reset signal is output;

a second activation circuit which outputs a second activation signal when a predetermined command is input, and, while the predetermined command is not input, does not output the second activation signal regardless of whether the power-on reset signal is output; and an activation determining circuit which, if at least one of the first and second activation signals is output, activates said read control circuit to output the control signal.

8. The semiconductor device wherein an electric card is equipped with the semiconductor device defined in claim 7.

9. An electric device comprising:

a card interface;

a card slot connected to said card interface; and an electric card electrically connected to said card slot, wherein said electric card is equipped with the semiconductor device defined in claim 7.

* * * * *